United States Patent
Huckabay et al.

(10) Patent No.: US 7,861,196 B2
(45) Date of Patent: Dec. 28, 2010

(54) SYSTEM AND METHOD FOR MULTI-EXPOSURE PATTERN DECOMPOSITION

(75) Inventors: Judy Huckabay, Fremont, CA (US);
Weiping Fang, Fremont, CA (US);
Chung-Shin Kang, San Jose, CA (US);
Shiying Zhou, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 149 days.

(21) Appl. No.: 12/023,512

(22) Filed: Jan. 31, 2008

(65) Prior Publication Data
US 2009/0199137 A1    Aug. 6, 2009

(51) Int. Cl.
G06F 17/50    (2006.01)
(52) U.S. Cl. .................................. 716/4; 716/1; 716/21
(58) Field of Classification Search ...................... 716/1, 716/4, 21
See application file for complete search history.

(56) References Cited

U.S. PATENT DOCUMENTS

2008/0069432 A1* 3/2008 Hsu et al. ................... 382/145
2008/0144969 A1* 6/2008 Park .......................... 382/276
2009/0148783 A1* 6/2009 Socha ........................... 430/5
2010/0017779 A1* 1/2010 Kim ............................ 716/21
2010/0037200 A1   2/2010 Ghan et al.

OTHER PUBLICATIONS

U.S. Appl. No. 12/251,455, filed Oct. 14, 2008, Wang, Xiaojun, et al.

* cited by examiner

*Primary Examiner*—Jack Chiang
*Assistant Examiner*—Suchin Parihar
(74) *Attorney, Agent, or Firm*—Adeli & Tollen LLP

(57) ABSTRACT

Some embodiments provide a method and system for identifying error markers for patterns within a design layout that do not meet the manufacturing constraints. Some embodiments extend a region from the error marked region to extract a pattern for decomposition analysis. Some embodiments compare the extracted pattern to known patterns stored in a library, which also stores at least one previously computed decomposition solution for each known pattern. For an extracted pattern existing within the library, some embodiments retrieve the previously computed decomposition solution from the library. For an extracted pattern that does not exist within the library, some embodiments use one or more simulations to determine a decomposition solution for the extracted pattern. The resulting decomposition solution replaces the extracted pattern within the design layout producing a variant of the original layout that contains the decomposed solution for the pattern.

31 Claims, 22 Drawing Sheets

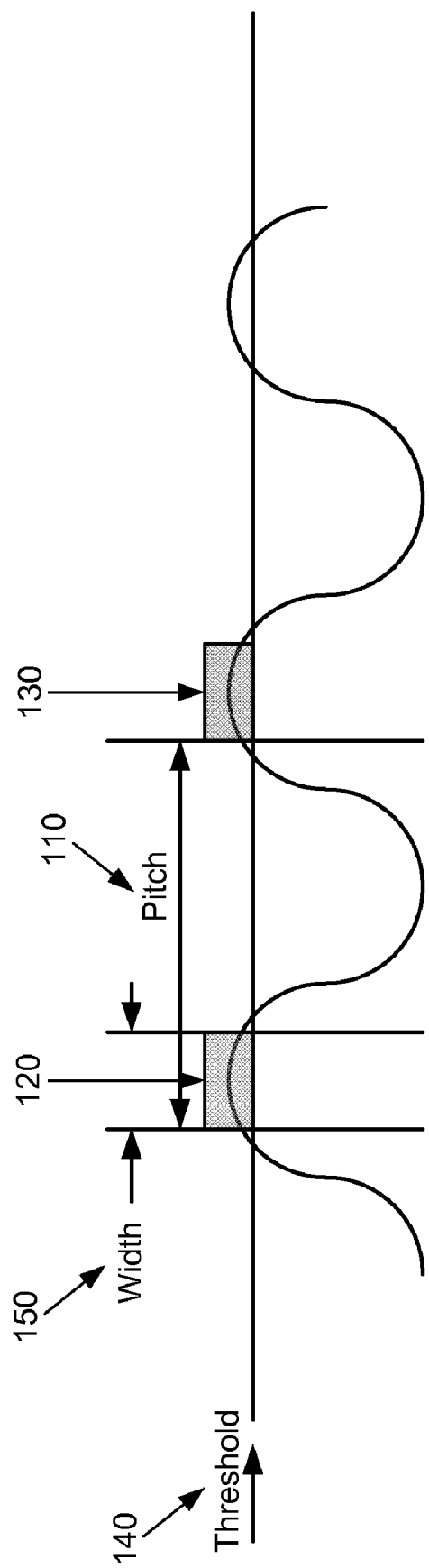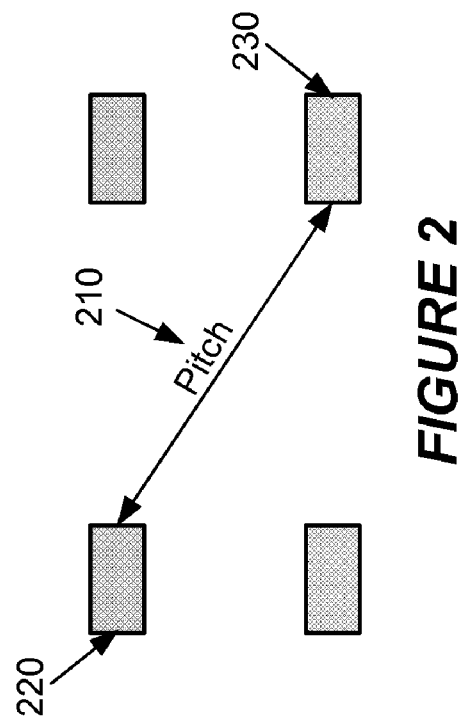

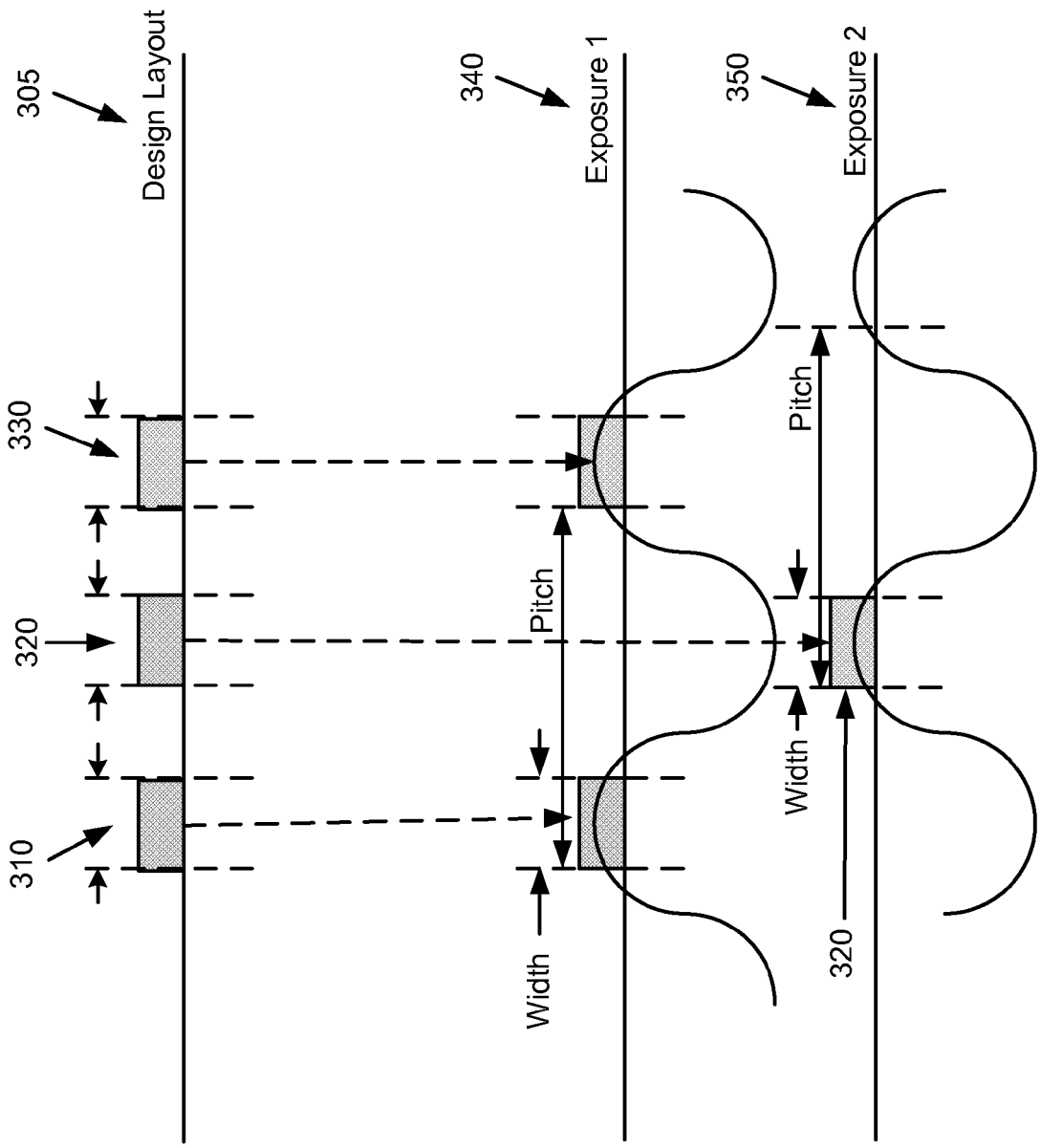

SYSTEM AND METHOD FOR MULTI-EXPOSURE PATTERN DECOMPOSITION

FIELD OF THE INVENTION

The invention relates to the design and manufacture of integrated circuits. Specifically, to systems and methods for improving the photolithographic process of manufacturing an integrated circuit.

BACKGROUND OF THE INVENTION

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

Design engineers design ICs by transforming logical or circuit descriptions of the ICs' components into geometric descriptions, called design layouts. IC design layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. In this fashion, design layouts often describe the behavioral, architectural, functional, and structural attributes of the IC.

To create the design layouts, design engineers typically use electronic design automation ("EDA") applications. These applications provide sets of computer-based tools for creating, editing, analyzing, and verifying design layouts.

Fabrication foundries ("fabs") manufacture ICs based on the design layouts using a photolithographic process. Photolithography is an optical printing and fabrication process by which patterns on a photolithographic mask (photo mask) are imaged and defined onto a photosensitive layer coating a substrate. To fabricate an IC, photo masks are created using the IC design layout as a template. The photo masks contain the various geometries (i.e., features) of the IC design layout. The various geometries contained on the photo masks correspond to the various base physical IC elements which comprise functional circuit components such as transistors, interconnect wiring, via pads, as well as other elements which are not functional circuit elements but are used to facilitate, enhance, or track various manufacturing processes. Through sequential use of the various photo masks corresponding to a given IC in an IC fabrication process, a large number of material layers of various shapes and thicknesses with various conductive and insulating properties may be built up to form the overall IC and the circuits within the IC design layout.

As circuit complexity continues to increase and transistor designs become more advanced and ever smaller in size, advances in photolithographic processes are being pursued to enable the large scale, low cost manufacturing of such circuits. However, constraining factors in traditional photolithographic processes limit the effectiveness of current photolithographic processes. Some such constraining factors include pitch and width constraints associated with the lights/optics used within photolithographic processing systems.

A pitch specifies a sum of the width of a feature and the space on one side of the feature separating that feature from a neighboring feature. Depending on the photolithographic process at issue, factors such as optics and wavelengths of light or radiation restrict how small the pitch may be made before features can no longer be reliably printed to a wafer or mask. As such, the smallest size of any features that can be created on a wafer is severely limited by the pitch.

FIGS. 1 and 2 illustrate typical pitch constraints imposed by a photolithographic process. In FIG. 1, an orthogonal pitch 110 acts to constrain the spacing between printable features 120 and 130 of a design layout, while in FIG. 2 a diagonal pitch 210 acts to constrain the spacing between features 220 and 230. While other photolithographic process factors such as the threshold 140 can be used to narrow the width 150 of the features 120 and 130, such adjustments do not result in increased feature density without adjustments to the pitch 110 or 210. As a result, increasing feature densities beyond a certain threshold is infeasible via a pitch constrained single exposure process.

Certain reticle enhancement techniques (RET) allow for photolithographic processes to extend beyond some of the various photolithographic manufacturing constraints such as the width constraint. Some common techniques include: using optical proximity correction (OPC) to distort photo mask shapes to compensate for image errors resulting from diffraction or process effects that cause pattern inaccuracies, using off-axis illumination (OAI) for optimizing the angle of illumination for a particular pitch, using alternating phase shift masks (PSM) for improving lithographic resolution by introducing a particular phase shift between adjacent patterns or features on a photo mask, and using scatter bars to place narrow lines or spaces adjacent to a feature in order to make a relatively isolated line behave more like a dense line.

However, these and other techniques are limited both by cost and effectiveness. Moreover, the reticle enhancement techniques described above do not overcome the pitch constraints of FIG. 1. To overcome the pitch constraints, some fabrication processes have implemented a multiple exposure photolithographic process as illustrated in FIG. 3.

In FIG. 3, a design layout 305 specifies three features 310-330 that are pitch constrained and therefore cannot be photolithographically printed with a conventional single exposure process. Analysis of the characteristics (e.g., the pitch) of the available photolithographic process and of the design layout 305 results in the decomposition of the design layout 305 into a first exposure 340 for printing features 310 and 330 and a second exposure 350 for printing feature 320. As such, the features 310 and 330 are assigned to a first photo mask for printing during the first exposure 340 and feature 320 is assigned to a second photo mask for printing during the second exposure 350. Several examples of such processes are provided in U.S. patent application Ser. No. 11/405,029 entitled "Method and System for Printing Lithographic Images with Multiple Exposures", filed on Apr. 14, 2006, issued as U.S. Pat. No. 7,310,797.

Existing decomposition tools for performing layout decomposition are often rule based. Such tools are therefore applicable only to patterns for which a pre-programmed or known decomposition solution exists within a library. These tools are effective for decomposing simple designs with regular repeating patterns such as gradings including lines and spaces. However, design layouts with more sophisticated designs (e.g., logic designs and microprocessor designs containing complex patterns and shapes with bends and jogs) cannot be processed using these existing decomposition tools as solutions do not exist for the unique patterns appearing within such design layouts. Instead, layout designers would be notified of the patterns for which a known solution does not exist. The layout designers would then be prompted to manually produce a decomposition solution for these patterns.

Moreover, existing decomposition tools are inefficient in the manner by which they perform decomposition analysis. Repeated polygonal patterns within a single design layout are each independently analyzed and a solution is provided for each instance as if each instance is the first such instance. The prior art fails to build upon and leverage the knowledge that could be gleaned from the earlier passes through the layout and the newly entered decomposition solutions received from the design engineers. For example, for a pattern with an unknown decomposition solution, the layout designer would be prompted to produce a decomposition solution. The solution received from the layout designer would be integrated into the design but would not be integrated into the library of existing solutions where the solution could be reused for a similar pattern subsequently encountered during decomposition analysis.

Furthermore, the effectiveness of prior art decomposition processes is further limited as potential photolithographic printing errors and other errors remain undetected. For instance, a decomposition of a design layout may logically appear to be error free. However, various photolithographic errors such as pinching, necking, and various other printing errors may be produced by the photolithographic process after the logical decomposition is physically printed onto a wafer. Such errors often lead to opens between otherwise connected circuits and shorts between otherwise unrelated circuits in the physical implementation. Without proper simulation of the photolithographic printing, such errors remain undetected.

Therefore, there is a need to efficiently and effectively decompose an entire layout or section of a layout and to simulate the decomposed layout or section of the layout to account for potential photolithographic printing errors. There is a need for such operations to reuse existing known solutions and to provide solutions for unknown patterns within a design layout by computing new solutions through the various simulations that validate a give solution. There is further a need for an adaptable system and method that stores and reuses newly computed decomposition solutions so that such decomposition solutions are not continually recomputed at each instance a pattern is encountered within a design layout.

SUMMARY OF THE INVENTION

Some embodiments provide a method and system for optimally decomposing patterns of features within a particular layer of a design layout that do not meet specified manufacturing constraints. In some such embodiments, these patterns are decomposed into multiple geometric shapes for printing in two or more exposures. Together, the two or more exposures print the patterns and satisfy the manufacturing constraints.

To facilitate pattern decomposition, some embodiments provide one or more geometric rules to identify error markers for patterns within the design layout that do not meet the manufacturing constraints. Some embodiments extend a region from the error marked region to extract a pattern for decomposition analysis. In some embodiments, the extended region also includes data relating to neighboring patterns within the design layout.

Some embodiments compare the extracted pattern to known patterns stored in a library, which also stores at least one previously computed valid or optimal decomposition solution for each known pattern. For an extracted pattern existing within the library, some embodiments retrieve the previously computed decomposition solution from the library. For an extracted pattern that does not exist within the library, some embodiments use one or more simulations to determine a valid or optimal decomposition solution for the extracted pattern. The resulting decomposition solution, either retrieved from the library or determined via the simulations, replaces the extracted pattern within the design layout producing a variant of the original layout that contains the decomposed solution for the pattern.

In some embodiments, the decomposition solution identifies an optimal location for dividing the extracted pattern into two or more geometric shapes. Each shape is for subsequent assignment to a particular photo mask for printing during a particular exposure of a multi-exposure photolithographic process. To facilitate decomposition analysis, some embodiments provide a library that is pre-programmed with decomposition solutions for known patterns. Hence, the decomposition solution for subsequent instances of the known patterns appearing within a design layout can be computed in linear time by querying the library to retrieve the decomposition solutions stored within the library.

For those unique patterns not within the library, some embodiments specify one or more different decompositions for the patterns and determine which of the decompositions provides valid or optimal printability by subjecting each specified decomposition to one or more simulations including: lithographic simulation, chemical mechanical polishing simulation (CMP), hotspot simulation, critical area analysis simulation, mask overlay error tolerance simulation, mask loading effect simulation, mask edge placement simulation, or flash count simulation to name a few examples. Some embodiments quantify the simulation results by assigning values to each simulation result. Based on the assigned values, an optimal decomposition solution is identified from the several potential decomposition solutions.

The unique pattern along with the newly determined decomposition solution are then stored in the library so that subsequent instances of the extracted pattern in the same or different design layouts need not be recomputed. As the decomposition process of some embodiments is performed over various different layouts, the decomposition process continually acquires new information with which to apply to subsequent decompositions for the same or different layouts. In this manner, the effectiveness and efficiency by which some embodiments decompose entire design layout increases with each iteration.

BRIEF DESCRIPTION OF THE SEVERAL VIEWS OF THE DRAWINGS

The novel features of the invention are set forth in the appended claims. However, for purpose of explanation, several embodiments of the invention are set forth in the following figures.

FIG. 1 illustrates a typical orthogonal pitch constraint imposed by a photolithographic process.

FIG. 2 illustrates a typical diagonal pitch constraint imposed by a photolithographic process.

FIG. 3 illustrates a fabrication processes implementing a multiple exposure photolithographic process, in accordance with some embodiments.

DETAILED DESCRIPTION OF THE INVENTION

Figure 4:
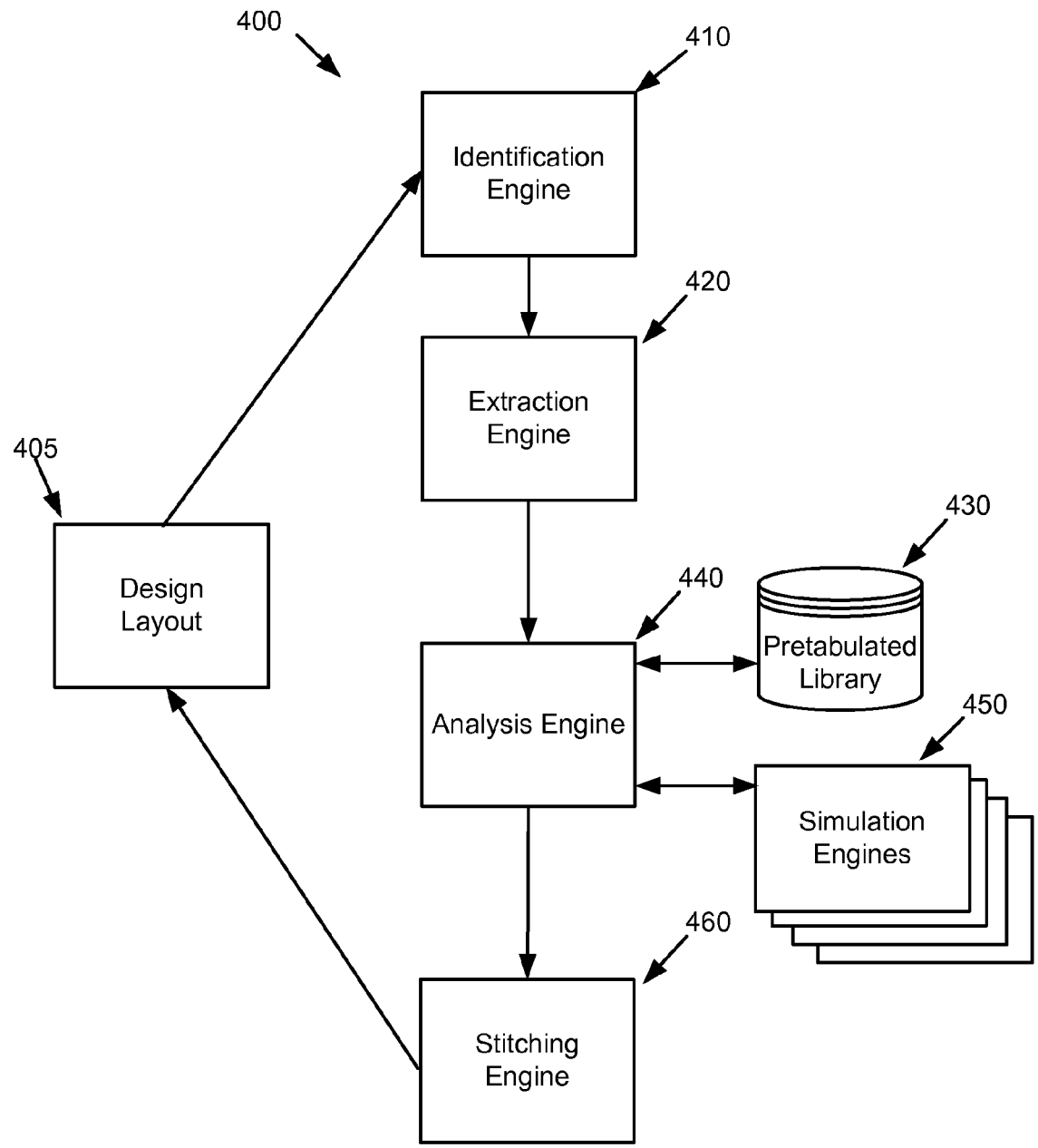
FIG. 4 presents a software architecture for facilitating the photolithographic decomposition simulation performed by some embodiments.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

Some embodiments provide a method and system for optimally decomposing patterns of features within a particular layer of a design layout that do not meet specified manufacturing constraints. In some such embodiments, these patterns are decomposed into multiple geometric shapes for printing in two or more exposures. Together, the two or more exposures print the patterns and satisfy the manufacturing constraints.

To facilitate pattern decomposition, some embodiments provide one or more geometric rules to identify error markers for patterns within the design layout that do not meet the manufacturing constraints. Some embodiments extend a region from the error marked region to extract a pattern for decomposition analysis. In some embodiments, the extended region also includes data relating to neighboring patterns within the design layout.

Some embodiments compare the extracted pattern to known patterns stored in a library, which also stores at least one previously computed valid or optimal decomposition solution for each known pattern. For an extracted pattern existing within the library, some embodiments retrieve the previously computed decomposition solution from the library. For an extracted pattern that does not exist within the library, some embodiments use one or more simulations to determine a valid or optimal decomposition solution for the extracted pattern. The resulting decomposition solution, either retrieved from the library or determined via the simulations, replaces the extracted pattern within the design layout producing a variant of the original layout that contains the decomposed solution for the pattern.

In some embodiments, the decomposition solution identifies an optimal location for dividing the extracted pattern into two or more geometric shapes. Each shape is for subsequent assignment to a particular photo mask for printing during a particular exposure of a multi-exposure photolithographic process. To facilitate decomposition analysis, some embodiments provide a library that is pre-programmed with decomposition solutions for known patterns. Hence, the decomposition solution for subsequent instances of the known patterns appearing within a design layout can be computed in linear time by querying the library to retrieve the decomposition solutions stored within the library.

For those unique patterns not within the library, some embodiments specify one or more different decompositions for the patterns and determine which of the decompositions provides valid or optimal printability by subjecting each specified decomposition to one or more simulations including: lithographic simulation, chemical mechanical polishing simulation (CMP), hotspot simulation, critical area analysis simulation, mask overlay error tolerance simulation, mask loading effect simulation, mask edge placement simulation, or flash count simulation to name a few examples. Some embodiments quantify the simulation results by assigning values to each simulation result. Based on the assigned values, an optimal decomposition solution is identified from the several potential decomposition solutions.

The unique pattern along with the newly determined decomposition solution are then stored in the library so that subsequent instances of the extracted pattern in the same or different design layouts need not be recomputed. As the decomposition process of some embodiments is performed over various different layouts, the decomposition process continually acquires new information with which to apply to subsequent decompositions for the same or different layouts. In this manner, the effectiveness and efficiency by which some embodiments decompose entire design layout increases with each iteration.

Several more detailed embodiments of the invention are described in the sections below. Section II provides an overview of the software architecture used by some embodiments to implement the system and method for providing multi-exposure pattern layout decomposition. Next, Section III describes some of the various simulations used in determining a decomposition solution. Lastly, Section IV provides a description of a system architecture with which some embodiments of the invention are implemented.

II. Architecture

FIG. 4 presents a conceptual diagram of the software architecture 400 for implementing the multi-exposure pattern decomposition method of some embodiments of the invention. This pattern decomposition method decomposes into several geometric shapes patterns of features (i.e., polygonal elements of layout features) appearing within particular layers of a design layout that do not meet manufacturing constraints. Each of the multiple geometric shapes is assigned to two or more photo masks for printing during different exposures of a multi-exposure photolithographic process. As illustrated in this figure, architecture 400 includes: (1) a design layout 405, (2) an identification engine 410 for marking those patterns within different layers of the design layout 405 that do not satisfy one or more manufacturing constraints, (3) an extraction engine 420 for extracting patterns at the error marked regions, (4) an analysis engine 440 for receiving the extracted patterns and for determining decomposition solutions, (5) a library 430 for providing decomposition solutions for previously processed patterns to the analysis engine 440, (6) one or more simulation engines 450 for determining the effectiveness of a particular decomposition solution for a pattern not within the library, and (7) a stitching engine 460 for replacing the extracted pattern within the design layout 405 with the determined decomposition solution.

In some embodiments, some of these components are third-party tools that may be integrated into the overall system. Also, it should be apparent to one of ordinary skill in the art that some embodiments implement two or more of the above described engines as a single engine or include additional or fewer components in conjunction with some or all the components presented in FIG. 4.

Figure 5:
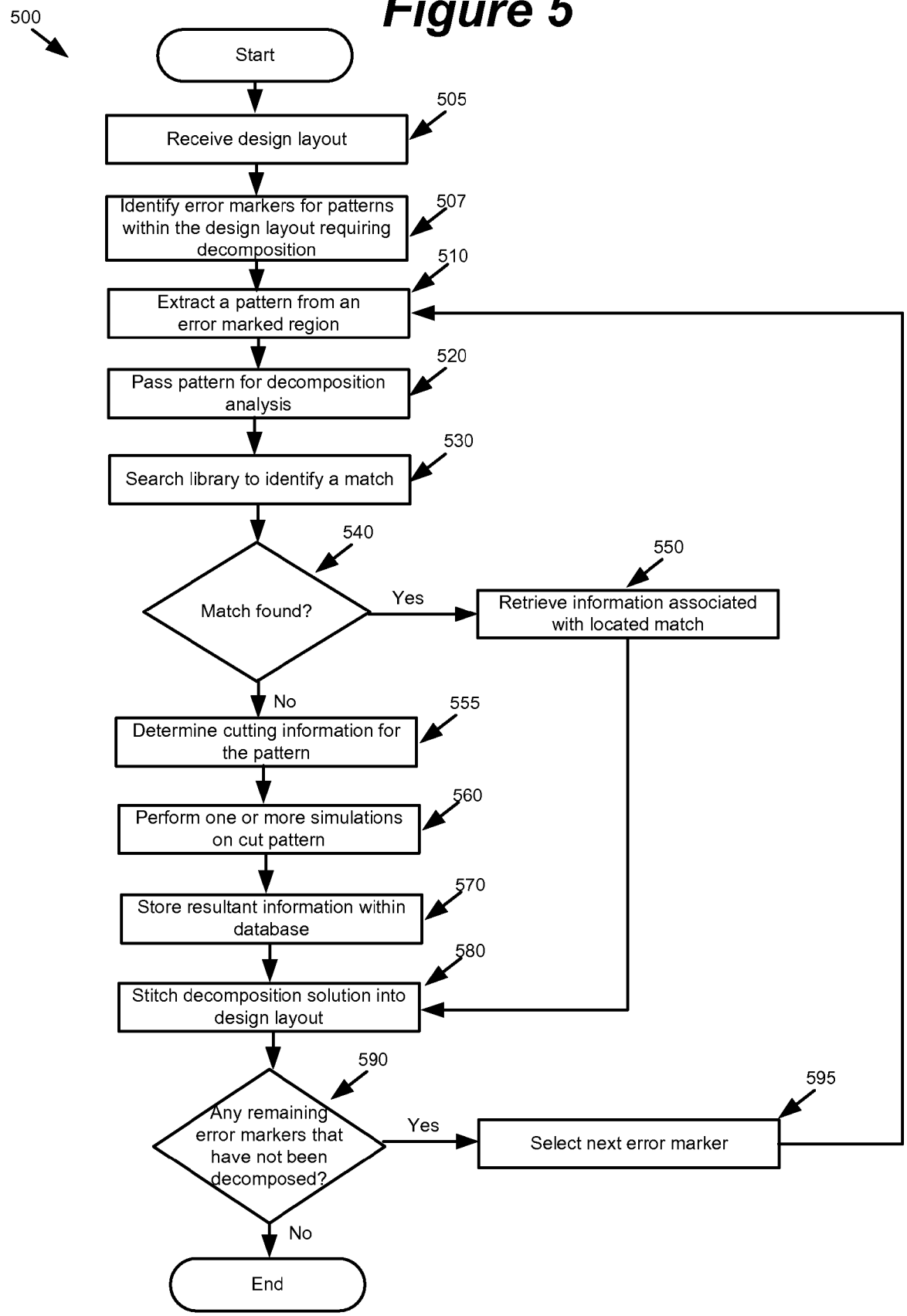
FIG. 5 presents a process that conceptually illustrates the operations performed by the various components of FIG. 4 in accordance with some embodiments.

FIG. 5 presents a process 500 that conceptually illustrates the operations performed by the various components of FIG. 4 in accordance with some embodiments. In FIG. 5, the pattern decomposition process 500 commences when the identification engine 410 receives (at 505) a design layout. The identification engine 410 identifies (at 507) error markers for particular patterns within different layers of the design layout that require decomposition. Such identified patterns cannot be printed using a single exposure because the patterns violate one or more geometric constraints. In some embodiments, the geometric constraints correspond to various manufacturing constraints of a photolithographic process (e.g., orthogonal or diagonal pitch constraints).

Figure 6:
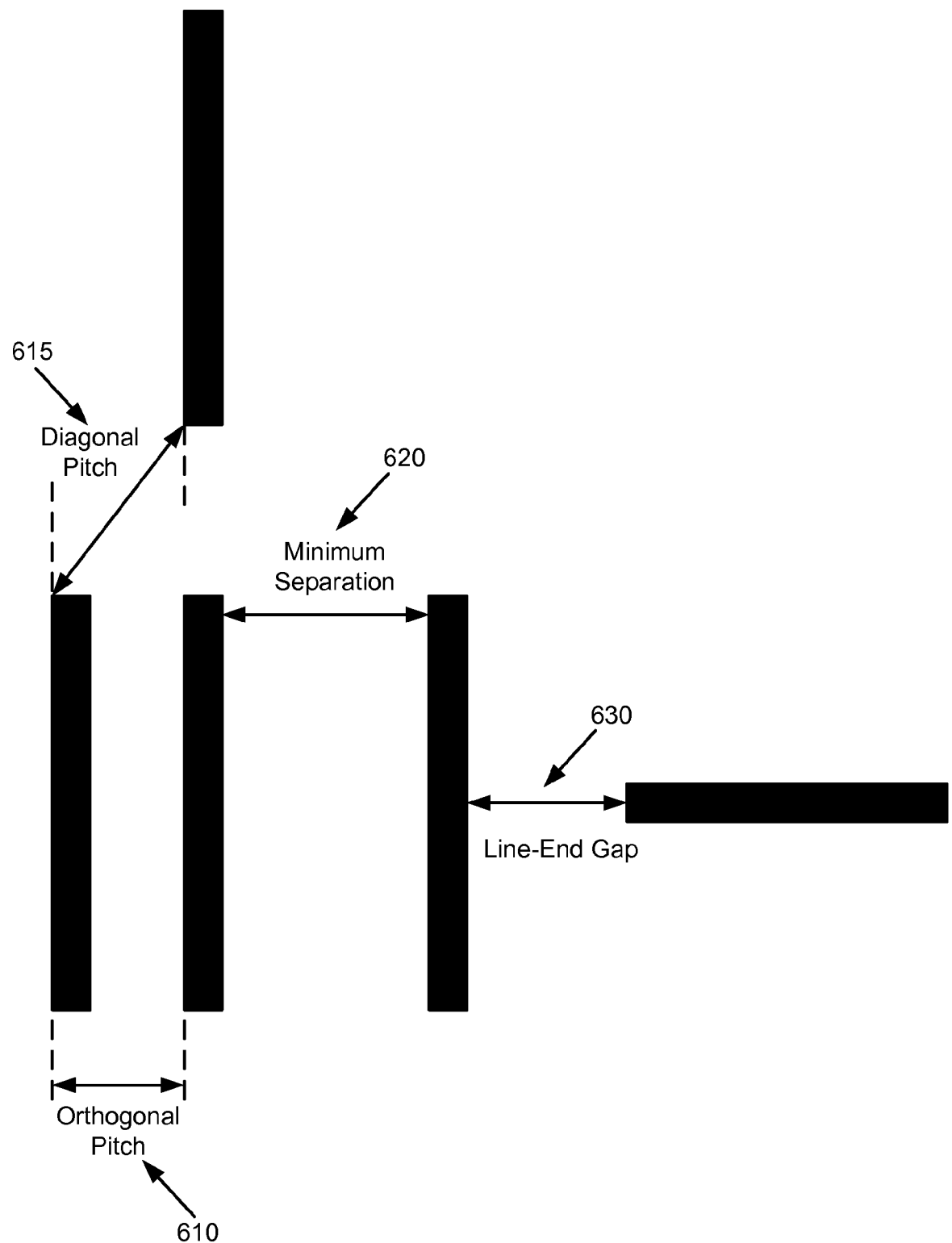
FIG. 6 illustrates the pitch constraints and various other geometric constraints that can be used to identify polygonal features of a layout that require decomposition.

FIG. 6 illustrates some of the various geometric constraints used by some embodiments to identify the error markers for patterns requiring decomposition. One geometric constraint includes identifying the proximity of different features of a design layout with respect to one another. As described above, the proximity of such features may impose orthogonal 610 or diagonal 615 pitch constraints. The minimum separation 620 constraint specifies a minimum distance between various layout features that if violated could potentially result in a short between two or more circuits, as diffraction within the photolithographic printing process could cause a mixture of the edge gradients of the features. One method for defining the minimum separation value is to use the Rayleigh limit (i.e., the resolution) of the photolithographic printing tool. The line-end gap 630 specifies the minimum distance required within a design layout to prevent lines from combining. A short may occur in instances where lines combine as a result of the optics associated with a particular photolithographic process. It should be apparent to one of ordinary skill in the art that some embodiments implement various other geometric rules to identify the error markers for patterns requiring decomposition.

In some embodiments, an error marker is defined as a pattern that includes polygons for an entire feature violating one or more constraints, polygons for a portion of a feature that violates one or more constraints, or polygons for one or more features violating one or more constraints. For instance, if a first polygon of a first feature and a second polygon of a second feature together violate an orthogonal pitch constraint, then an error marker is defined to include both the first and second polygons. However, the error marker need not include all polygons for the first and second features so long as the shape included within the error marker includes the polygons violating the one or more constraints and the shape within the error marker is adequate for decomposition onto separate photo masks of a multi-exposure photolithographic process.

It should be apparent to one of ordinary skill in the art that some embodiments employ different heuristics to determine the polygons or shapes to include within the error marker. For instance, some embodiments utilize heuristics that identify polygons that logically perform a common function to include within the error marker, such as polygons that together create a segment of a wire. In other embodiments, the heuristics for determining the error marker identify a particular location within the IC design layout that violates the one or more constraints without including polygonal information.

In some embodiments, the process 500 identifies (at 507) all error markers for one or more layers of the design layout before passing all the identified error markers to the extraction engine 420 for pattern extraction. In other embodiments, the process 500 identifies (at 507) a single error marker for a pattern that does not meet the geometric rules and upon identifying such a pattern, the process 500 passes the single error marker to the extraction engine 420 for pattern extraction. In some such embodiments, the process 500 performs the decomposition analysis steps of 520-580 after identifying the single error marker. The process 500 then continues the traversal through the one or more layers of the design layout to identify additional error markers at 595.

Upon receiving the error markers, the extraction engine 420 extracts (at 510) a pattern from a lithographic area of interest around the error marker by extending a region outwards from the error marker. Though the error marked region contains the pattern requiring decomposition, the additional information encompassed within the lithographic area of interest provides the necessary information for determining the validity or optimality of a given decomposition solution for the pattern within the error marked region.

The amount of information to be included within the lithographic area of interest varies depending on the number of geometric constraints violated by the particular pattern at the error marked region and the types of constraints violated. For instance, for a pattern violating an orthogonal pitch constraint, some embodiments extend the lithographic area of interest to include polygons at the next orthogonal pitch. In this manner, some embodiments can determine a decomposition solution that ameliorates the orthogonal pitch constraint at the error marked region while also verifying that the decomposition solution does not violate other pitch constraints with other neighboring polygons by accounting for the impact of the decomposition solution to the neighboring polygons.

Figure 7:
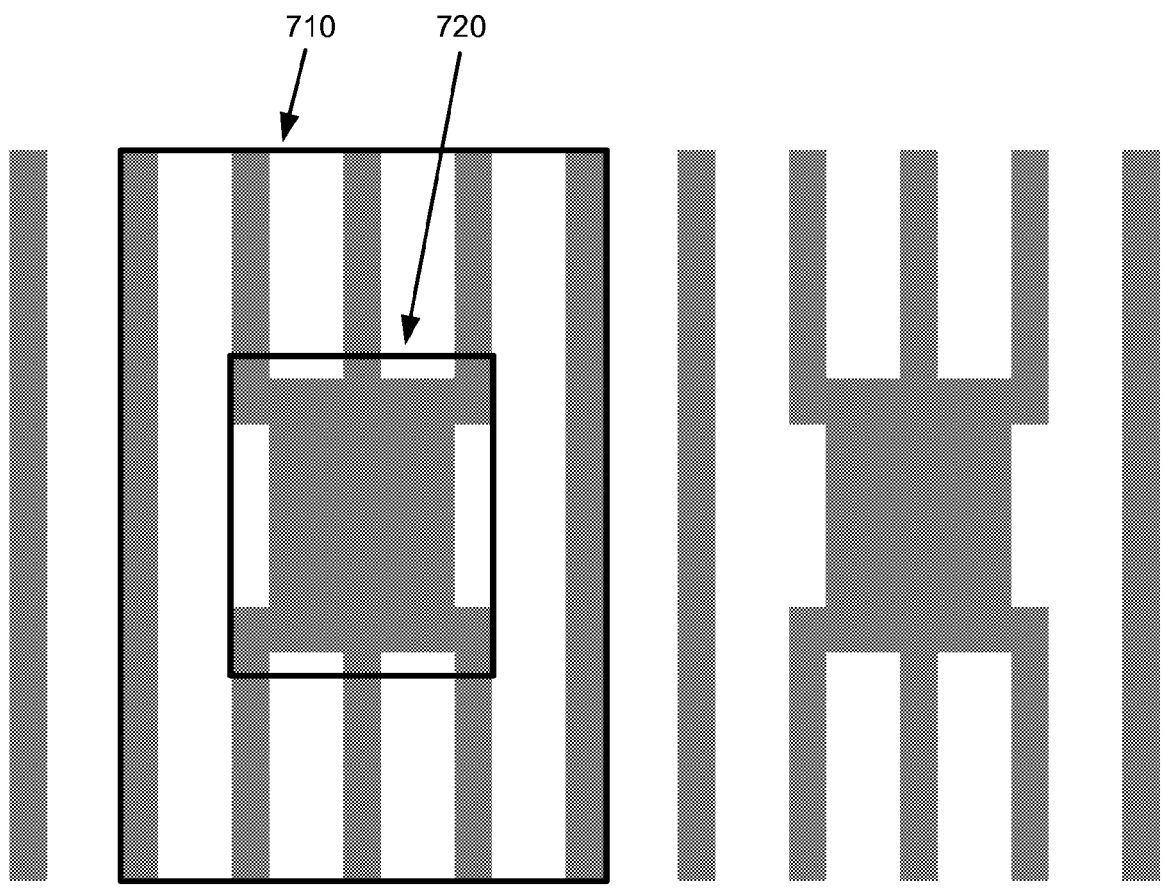
FIG. 7 illustrates an error marked pattern and a corresponding extended lithographic area of interest.

FIG. 7 illustrates an error marked pattern and a corresponding extended lithographic area of interest. In this figure, the error marker identifies the polygons found within region 720 as a pattern violating one or more geometric constraints. The information contained within the error marked region 720 is insufficient for determining an optimal decomposition solution for the pattern in the error marked region 720. Therefore, some embodiments extend a lithographic region of interest 710 outward from the error marker. As illustrated in FIG. 7, the region 710 is uniformly extended outwards. The extended region 710 contains polygons that neighbor the error marked region 720. These neighboring polygons specify shapes of the same or different features within the error marked region 720. It should be apparent to one of ordinary skill in the art that the extended region may be extended using a non-uniform extension.

Accordingly, the extracted pattern derived from the lithographic area of interest, like the identification of the error markers, is not limited to cover only pre-programmed patterns, but can be extended to include patterns of varying size, shape, or complexity (e.g., including bends, jogs, etc.). The extracted pattern may include additional polygons from the same or different features identified within the error marker. As described in further detailed below in Section III c), the additional polygons within the extended region of the extracted pattern provide the additional information that when accounted for assist in optimizing the decomposition for the polygons within the error marker.

After identifying the extracted pattern within the extended region, the process 500 passes (at 520) the extracted pattern to the analysis engine 440 so that the analysis engine 440 can determine a valid or optimal decomposition solution for the extracted pattern. The analysis engine 440 determines the decomposition solution using either the library 430 or the one or more simulation engines 450. First, the analysis engine 440 performs a query (at 530) into the library 430 to locate any matching patterns within the library for which a decomposition solution already exists. In some embodiments, queries are performed by generating keys based on characteristics of the particular pattern (e.g., number of bends, jogs, length of each vertical segment, number of vertical segments, width of each segment, etc.). However, it should be apparent to one of ordinary skill in the art that pattern matching, storage, and retrieval can be performed in any number of ways or through a variety of existing tools.

In some embodiments, the library 430 is a database storing unique patterns and at least one corresponding decomposition solution for each stored pattern. In some embodiments, the decomposition solutions within the library 430 not only specify a valid or optimal cutting location for dividing the pattern into multiple shapes that satisfy the manufacturing constraints, but also include results from previously run simulations, timing statistics, etc. Some patterns and decomposition solutions stored within the library 430 are pre-populated into the library 430 before distribution of the library 430. Other patterns and decomposition solutions are added to the library 430 as new patterns are extracted and their decomposition solutions are determined through the various iterations of the decomposition process 500. Determination of decomposition solutions for previously unknown patterns is described below with reference to steps 555-570 of FIG. 5.

If the process 500 identifies (at 540) a match for the extracted pattern within the library 430, the process does not perform a decomposition analysis for the pattern. Rather, the process retrieves (at 550) the decomposition solution associated with the matching entry from the library 430. The library decomposition solution retrieved at 550 is known to be valid or optimal since it will have already undergone extensive simulations prior to its storage within the library 430. Additionally, the retrieved decomposition solution provides the necessary information needed to decompose the pattern into multiple geometric shapes where each shape meets the manufacturing constraints of a particular photolithographic process. After 550, the process 500 transitions to 580 which will be further described below.

If the process cannot identify (at 540) an entry for the extracted pattern within the library 430, the process performs a set of operations to determine (at 555) the optimal decomposition for the extracted pattern. In other words, the pattern is unique and the pattern must be independently analyzed to determine a proper or optimal decomposition.

To determine the decomposition solution, some embodiments scan the extracted pattern identifying certain locations at which the pattern may be decomposed (i.e., cut into multiple shapes for assignment to different photo masks). Each decomposition location is analyzed to determine potential errors that may arise during photolithographic printing. In some embodiments, such analysis is conducted by way of the one or more simulation engines 450 that perform (at 560) one or more simulations for each potential decomposition solution. The analysis engine 440 therefore passes the identified decomposition solution to the simulation engines 450 to identify any actual or potential errors associated with the decomposition solution.

Some of the various simulations available for performing decomposition include photolithographic simulation, hotspot simulation, critical area analysis simulation, mask overlay error tolerance simulation, mask loading effect simulation, mask edge placement simulation, or flash count simulation, to name a few examples. Section III below provides a detailed description of the various simulations applicable to the decomposition analysis of some embodiments.

In some embodiments, the analysis engine 440 scores each decomposition solution using one or more metrics that quantify the results of the various simulations. Examples of metrics used by some embodiments include a metric for quantifying the preservation of line widths resulting from the printing of a particular decomposition solution, a metric for quantifying pinching resulting from the printing of a particular decomposition solution, a metric for quantifying an allowable amount of distributed capacitance (Cd) for a wire located within a resistance dominated net, a metric for quantifying an allowable amount of capacitance for a wire located within a capacitance dominated net, and a metric for quantifying an amount of bridging that results from overlay errors for the lithographic printing of a particular decomposition solution as will be discussed in further detail below.

Using the scores from the various metrics, the analysis engine 440 is able to compare the printability of each decomposition solution to a baseline threshold or compare the printability of each decomposition solution with respect to one or more other decomposition solutions. For instance, the analysis engine 440 may determine from the one or more simulations that a first decomposition solution preserves a line width better than a second decomposition solution. A score is assigned for the resulting line widths of each decomposition solution. The analysis engine 440 then determines from the one or more simulations that the second decomposition solution results in less pinching than the first decomposition solution and a score is assigned for the amount of pinching resulting in each decomposition solution. If the score quantifying the amount of pinching is assigned greater weight than the score quantifying the preservation of line widths, then the second decomposition solution will be preferred or deemed optimal over the first decomposition solution.

In some embodiments, the weight or quantification associated with each simulation is a system specified parameter. However, it should be apparent to one of ordinary skill in the art that in some embodiments the weights or quantifications are user customizable. Such customizability allows users the ability to assign different levels of significance to each of the various simulations. In this manner, more or less dimensions of analysis may be incorporated into the process without affecting the overall process. For every new simulation dimension incorporated into the process, a weight or quantification is assigned to the new dimension. Similarly, as a simulation is removed from the process, the weight or quantification associated with the simulation is also removed and is no longer part of the simulation calculation.

With the analysis and simulation complete, the process creates (at 570) a new entry within the library 430 to store the pattern and the resultant decomposition information. The newly stored entry and its associated results are available for use with all subsequently identified patterns of a current layout and all subsequent layouts that undergo the process 500. In some embodiments, the stored pattern includes both the pattern within the error marked region and the neighboring polygons within the extended region extracted by the extraction engine. However, in other embodiments, the stored pattern includes only the pattern within the error marked region and the neighboring polygon information is discarded.

Additionally, some embodiments store each of the individual simulation scores in conjunction with the decomposition solution. This permits layout designers the ability to modify "weights" associated with each of the simulations and thus modify how the preferred decomposition solution is selected. Some embodiments select different decomposition solutions based on the relative weights assigned by the layout designer, where the layout design may emphasize the results of a particular simulation over other simulations. It should be apparent to one of ordinary skill in the art that some embodiments store each of the individual simulation scores as a single combined score where the combined score is derived by applying a weight to each score. In this manner, some embodiments reduce the amount of storage required to store the decomposition solution and the associated simulation scores and also reduce the time needed to compare score as the combined score is previously computed and stored.

After 570, the process 500 transitions to 580. As mentioned above, the process 500 also transitions to 580 from 550. At 580, the stitching engine receives the decomposition solution determined from the library (at 530-550) or from the decomposition analysis (at 555-560). The stitching engine 460 replaces (at 580) the pattern extracted at 510 with the received decomposition solution. Unlike existing prior art decomposition tools which simply report a pattern violating a geometric constraint to a layout designer to allow the layout designer to manually alter the design layout, the stitching engine 460 automatically replaces the extracted patterns within the design layout with the decomposition solution. The resultant decomposed patterns are aligned to the corresponding portions of the originally extracted pattern and the decomposition solution is incorporated into the layout.

After 580, the process 500 determines (at 590) whether all error markers have been analyzed. If additional error markers remain, the process 500 selects (at 595) the next identified error marker and performs the decomposition analysis steps 510-580 for the next selected error marker. As mentioned above, if the process 500 traverses the entire design layout during the identification of the error markers (at 507), then all subsequent error markers for decomposition analysis are already identified and the process 500 need only retrieve the subsequent error marker at 595. However, if the process 500 only traverses the design layout until encountering a single error marker, then the process 500 will resume at 595 the traversal of the design layout from the last identified error marker until a subsequent error marker is identified or all features of the design layout have been determined to satisfy the set of geometric constraints. Accordingly, the process 500 is iteratively performed until all features on each of the various design layout layers (e.g., wiring layers, metal layers, etc.) that violate one or more of the various geometric constraints are identified, extracted, decomposed, and replaced.

Since design layouts can contain millions of such features and since performing decomposition analysis and simulations on even a small subset of these features is time and processor intensive, some embodiments reduce the overall number of patterns for which decomposition analysis and simulations are performed by leveraging the known decomposition solutions for those patterns whose decomposition solution was previously computed and stored within the library. In this manner, time and processing resources are not wasted in duplicating results for known patterns. Instead, these resources can be better allocated to determining the optimal solution for those patterns for which solutions have not previously been computed. This permits some embodiments to implement more robust analysis and simulation that would otherwise be too time-consuming and processor intensive in prior art decomposition processes where each pattern undergoes the same level of simulation.

Moreover, the process 500 of FIG. 5 is an adaptive machine learning process. For every unique pattern that is encountered, the process 500 performs the analysis and the one or more simulations required to determine a proper or optimal decomposition solution for the unique pattern. By storing the decomposition solutions determined from the analysis and the one or more simulations within the library 430, the results can be reused upon the extraction of a pattern having the same properties (i.e., the same polygonal composition). Such subsequent patterns need not undergo the same robust analysis, instead a decomposition solution for the pattern can be solved within a fraction of the time by retrieving the stored results from the library.

Hence, for simple redesigns where only a minimal amount of the features are modified, the process 500 of FIG. 5 will be able to complete in less time as a majority of the patterns within the modified design will already have been processed and the decomposition solutions for such patterns will have been stored within the library. This form of adaptive learning has the added benefit of creating a customized process that becomes tailored to the tendencies of design layouts, since layout designers typically utilize the same design preferences and tendencies in subsequent design layouts.

III. Pattern Simulation

A. Overview

For each extracted pattern, there exists several potential decomposition solutions. Selection of a sub-optimal decomposition solution may result in unexpected bridging, pinching, necking, or shorts between different shapes of features in the design layout when the design is lithographically printed. Such unexpected behavior may result in logical errors when running the manufactured component or may result in electrical or physical damage to the component.

To avoid selecting a sub-optimal decomposition solution, some embodiments account for various printing errors by simulating the various decomposition solutions using one or more simulations. Each simulation accounts for one or more of the various photolithographic printing errors that may arise during fabrication of the design. Some such errors include errors resulting from chemical mechanical polishing (CMP), errors arising at critical areas of the design layout, mask overlay errors, and mask printability errors such as mask edge placement errors or mask loading effect errors. In some embodiments, other simulations account for various other characteristics of photolithographic printability such as flash count cost considerations.

Figure 8:
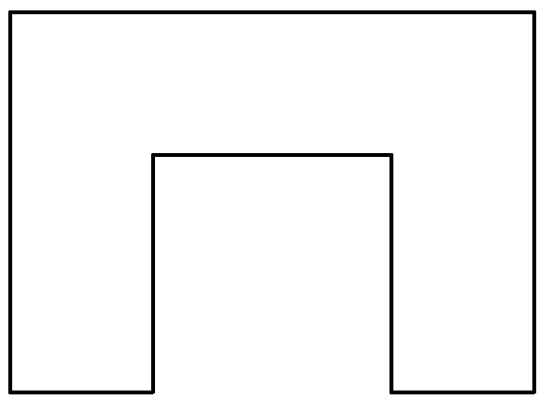
FIG. 8 illustrates a polygon for a feature that has been identified as unique and that requires cutting in order to be decomposed into two separate photo masks.
Figure 9:
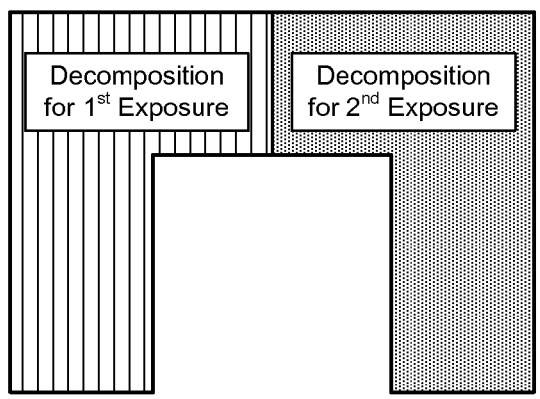
FIG. 9 illustrates a decomposition solution for the polygon of FIG. 8.
Figure 10:
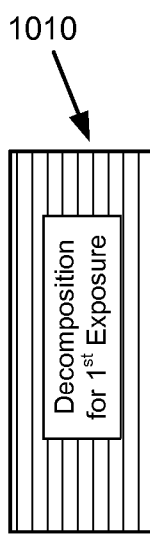
FIG. 10 illustrates an alternative decomposition solution for the polygon of FIG. 8.
Figure 11:
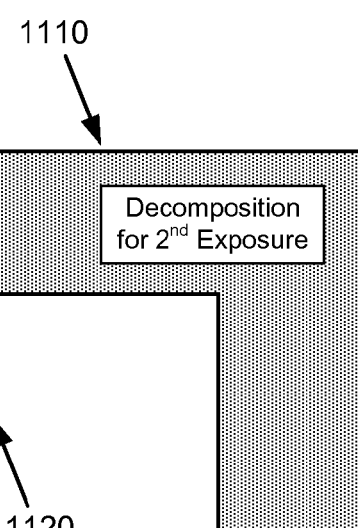
FIG. 11 illustrates an alternative decomposition solution for the polygon of FIG. 8.

FIG. 8 illustrates a pattern 810 of a design layout feature that has been extracted for decomposition. Since the polygon 810 is unique (i.e., a corresponding matching polygonal pattern could not be identified within the library), the analysis engine performs a process to decompose the pattern 810 into the two or more geometric shapes for assignment to different photo masks. FIGS. 9-11 illustrate potential decomposition solutions for the pattern 810 of FIG. 8.

In FIG. 9, the decomposition solution involves dividing the extracted pattern 810 into two equal shapes 910 and 920. Shape 910 is assigned to a first photo mask for printing during a first exposure and shape 920 is assigned to a second photo mask for printing during a second exposure of a multi-exposure photolithographic process. The decomposition solution of FIG. 10 involves dividing the pattern 810 into two unequal shapes along a vertical axis. A smaller shape 1010 for assignment to a first photo mask for a first exposure and a larger shape 1020 for assignment to a second photo mask for a second exposure of a multi-exposure photolithographic process. FIG. 11 provides yet another illustration of a potential decomposition solution for the pattern 810, where the pattern is divided along a horizontal axis. It should be apparent to one of ordinary skill in the art that various other potential decomposition solutions exist for the pattern 810 of FIG. 8.

Each of the decomposition solutions illustrated in FIGS. 9-11 may logically appear to satisfy manufacturing constraints. However, such a logical decomposition does not account for various issues that potentially arise during the actual fabrication of the design layout, such as photolithographic errors, overlay errors, edge placement errors, etc. Therefore, it is further the task of the analysis engine to determine which of the decomposition solutions presented in FIGS. 9-11 provides an optimal or preferred decomposition solution for printing within a particular multi-exposure process. To perform the optimal determination, some embodiments pass each of the solutions of FIGS. 9-11 to one or more simulation engines where fabrication and the various issues that arise during fabrication are simulated.

Some embodiments permit layout designers the ability to fine tune the amount of analysis and simulation that is performed. Layout designers can specify which simulations are important to their particular design layout. As new simulation techniques are developed, such techniques may be included within the decomposition analysis performed by some embodiments. In this manner, some embodiments avoid obsolescence by allowing these new simulation engines to be integrated into the decomposition analysis, further allowing some embodiments to adopt and function in conjunction with new photolithographic printing tools. Several examples of simulations utilized by some embodiments to facilitate decomposition analysis will now be described below.

B. Photolithographic Simulation

Figure 12:
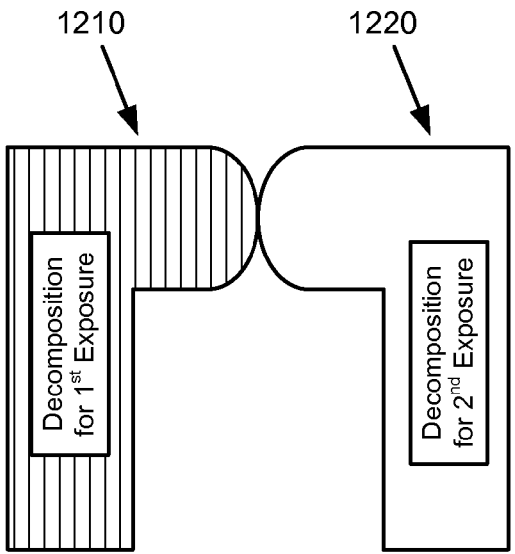
FIG. 12 illustrates a photolithographic simulation result for the corresponding decomposition solution presented in FIG. 9.
Figure 13:
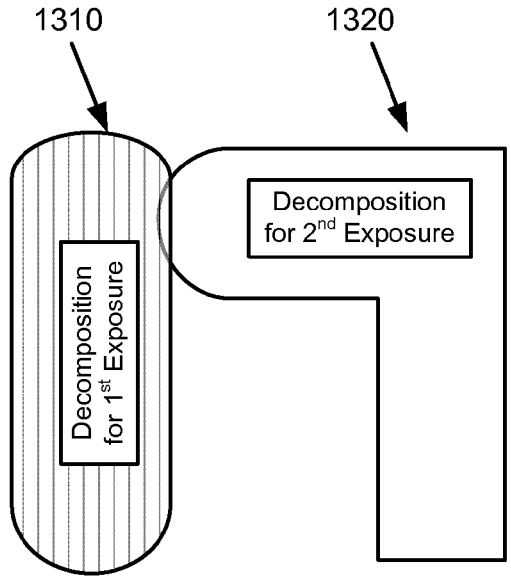
FIG. 13 illustrates a photolithographic simulation result for the corresponding decomposition solution presented in FIG. 10.
Figure 14:
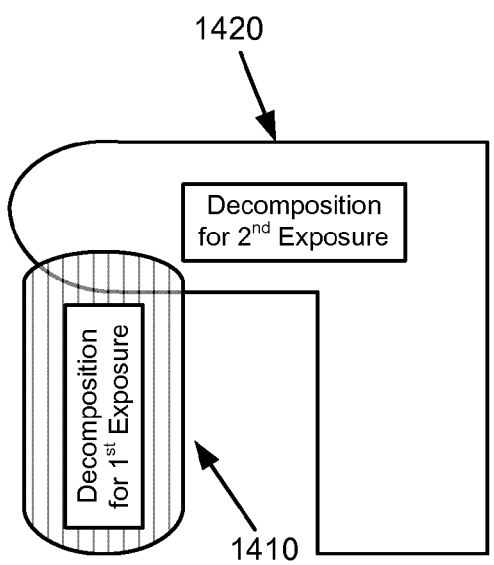
FIG. 14 illustrates a photolithographic simulation result for the corresponding decomposition solution presented in FIG. 11.

In some embodiments, the decomposed patterns undergo photolithographic simulation. FIGS. 12-14 illustrate the photolithographic simulation results for the corresponding decomposition solutions presented in FIGS. 9-11. For instance, FIGS. 12-14 each show varying degrees of pinching likely to occur during the photolithographic printing of the design layout. If the particular photolithographic process used in the fabrication of the design layout results in poor printing along the horizontal axis, then the overlapping area between shapes 1210 and 1220 of FIG. 12 is less than the overlapping area between shapes 1310 and 1320 of FIG. 13 and even less than the overlapping area between shapes 1410 and 1420 of FIG. 14. In other words, the amount of pinching identified by the simulation of FIG. 12 is greater than the amount of pinching identified by the simulation of FIG. 13 and the amount of pinching identified by the simulation of FIG. 13 is greater than the amount of pinching experienced by the simulation of FIG. 14. As a result, there is a higher probability for an open area to exist between the decomposed shapes of FIG. 9 than in between the decomposed shapes of either FIG. 10 or 11.

In some embodiments, the amount of pinching identified by the simulation is quantifiable into a numerical value. The quantified numerical value of some embodiments represents the amount of pinching experienced by one decomposition solution relative to another decomposition solution. In other embodiments, the quantified numerical value represents the amount of pinching experienced by one decomposition solution relative to a fixed value, which in some embodiments represents a decomposition solution that does not experience pinching. Thus, if the analysis engine strictly bases the optimal solution decision making on the photolithographic printing errors, then the decomposition solution of FIG. 10 provides a more optimal decomposition solution than FIG. 9, but the decomposition solution of FIG. 11 provides the most optimal decomposition solution of the three decomposition solutions.

C. OPC Assist Simulation

In some embodiments, optical proximity correction (OPC) assist feature simulation is performed in conjunction with or instead of photolithographic simulation. OPC assist simulation determines how a particular decomposition solution for a pattern or polygons neighboring the decomposed pattern affect the ability to improve the printability of the decomposed pattern using OPC assist features, such as scatter bars as one example. Specifically, since the number or type of OPC assist features that may be included on a photo mask is impacted by the manner of decomposition and the proximity of neighboring polygons, the optimality or validity of a given decomposition solution is similarly impacted.

The correlation between the OPC assist features, the decomposed pattern, and the neighboring polygons stems from the fact that each item requires a particular amount of surface area to be included on a photo mask. Though OPC assist features are not physically printed to a wafer, they nevertheless reside on the photo mask. As such, different decomposition solutions and neighboring polygons included within the lithographic area of interest for an extracted pattern having different space requirements affect which and how many OPC assist features may be included on the photo mask. Without OPC assist features, certain decomposition solutions when printed contain unexpected pinching, bridging, shorts, etc.

FIGS. 15 through 18 illustrate how OPC assist simulation assists in determining an optimal solution from a set of logically valid decomposition solutions for a given pattern. Specifically, the particular pattern error marked for decomposition is the pattern within the error marked region 720 of FIG. 7 and the additional information used within the OPC assist simulation includes the additional polygons within the lithographic region of interest 710.

Figure 15:
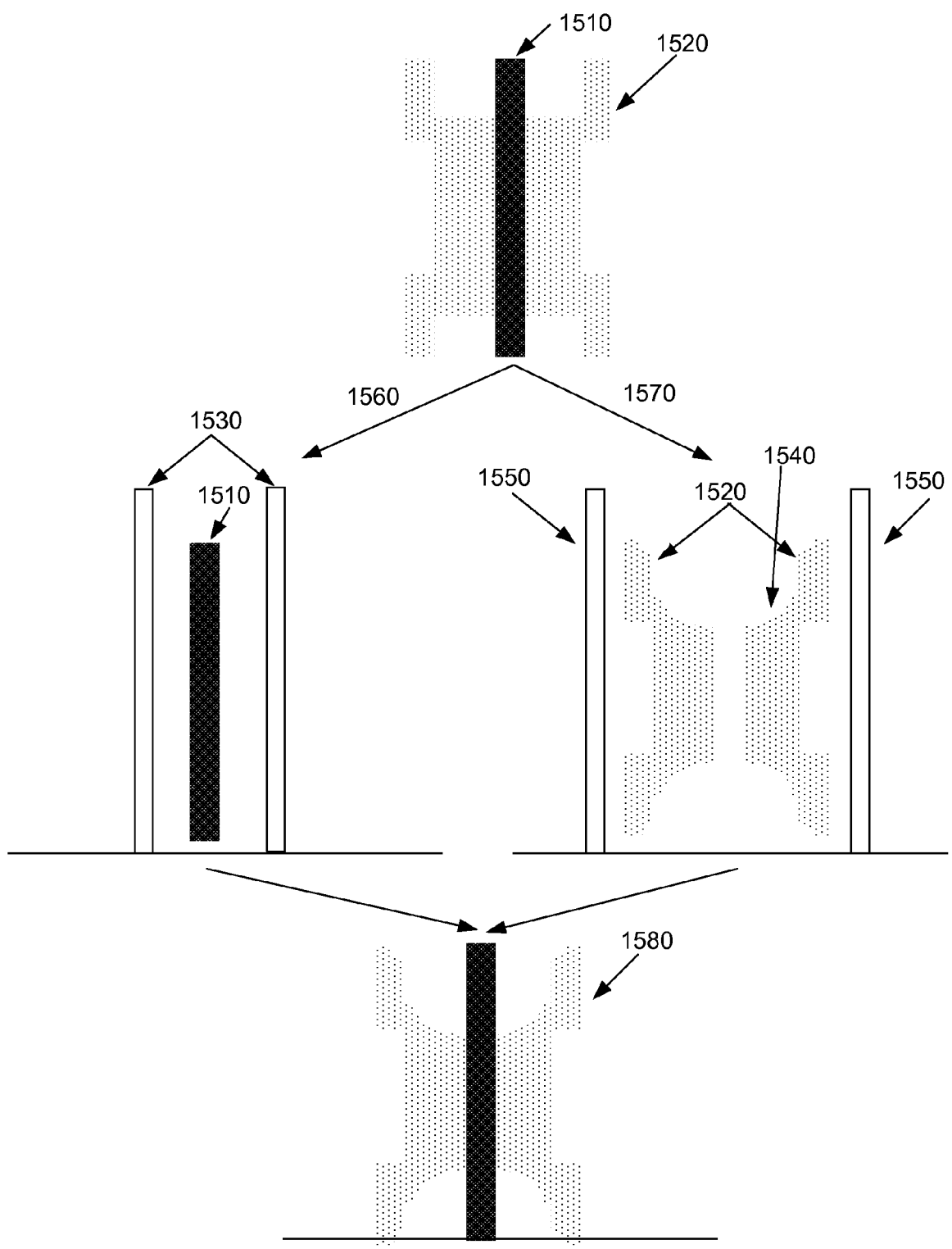
FIG. 15 presents a decomposition solution for the error marked region of FIG. 7.
Figure 16:
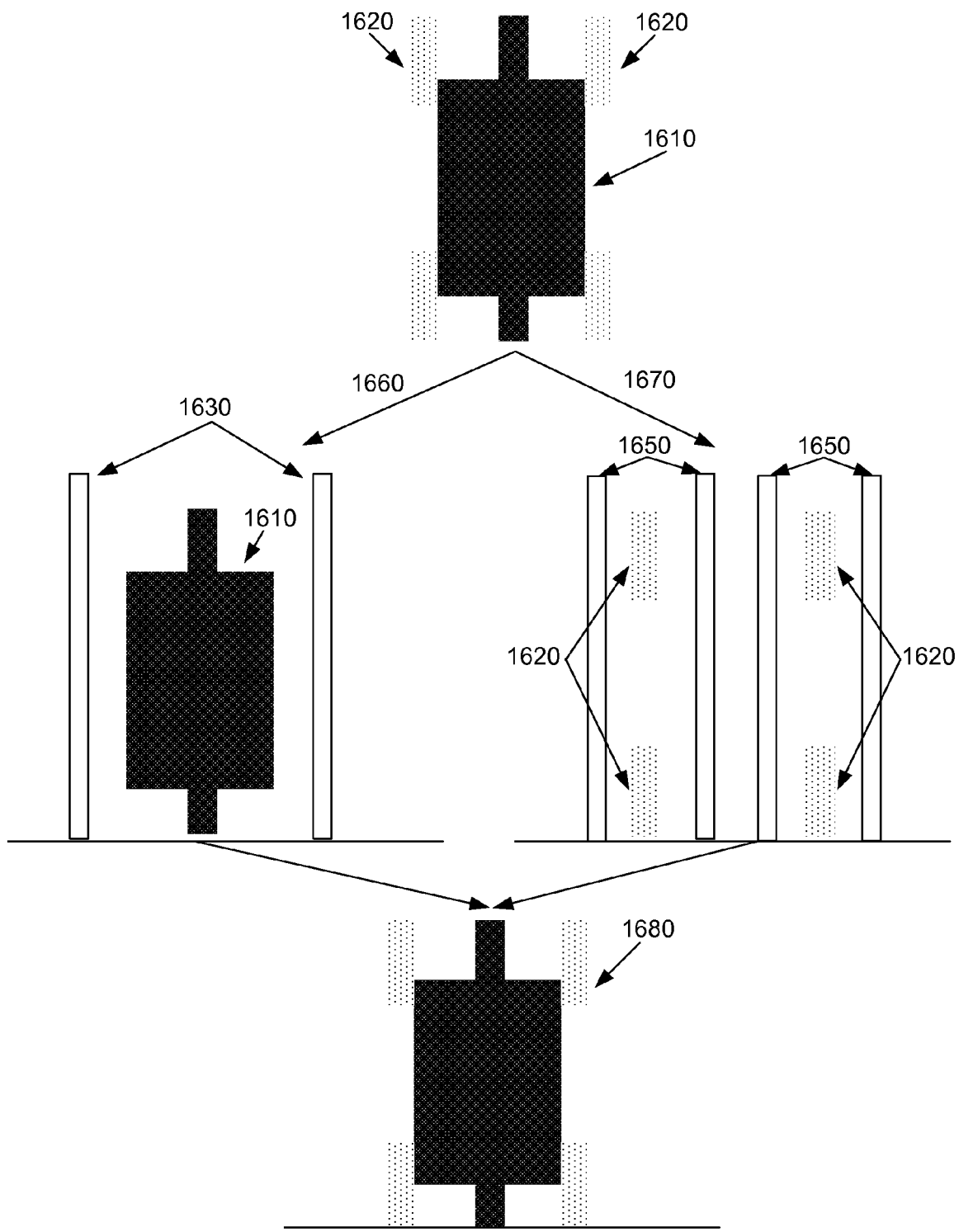
FIG. 16 presents an alternative decomposition solution for the error marked region of FIG. 7.

FIGS. 15 and 16 illustrate two possible decomposition solutions for the error marked region 720. Specifically, in FIG. 15 the decomposition solution specifies printing the error marked pattern 720 of FIG. 7 using two exposures. The first exposure prints shape 1510 and the second exposure prints shape 1520. The decomposition solution of FIG. 16 prints shape 1610 during a first exposure and shape 1620 during a second exposure.

Without including the neighboring polygonal information from the extended region 710 of FIG. 7, both decomposition solutions are valid solutions because OPC assist features, such as scatter bars, can be allocated to the photo mask to improve the photolithographic printing of each exposure. For example, OPC assist features 1530 are used to improve the printing of shape 1510 during the first exposure 1560 and OPC assist features 1550 are used to improve the printing of shape 1520 during the second exposure 1570. There is insufficient area at the center of shape 1520 to include OPC assist features, therefore some of the inner segments of the printed shape 1520, such as segment 1540, experience a minimal amount of pinching as a result. Nevertheless, the resulting printed pattern 1580 does not suffer from unexpected pinching that affects the performance of the printed feature.

Similarly, for the decomposition solution of FIG. 16, OPC assist features 1630 and 1650 are included to improve the lithographic printing of shapes 1610 and 1620 during first 1660 and second 1670 exposures. The resulting printed pattern 1680 also does not experience significant amounts of pinching that affects the performance of the printed feature.

Figure 17:
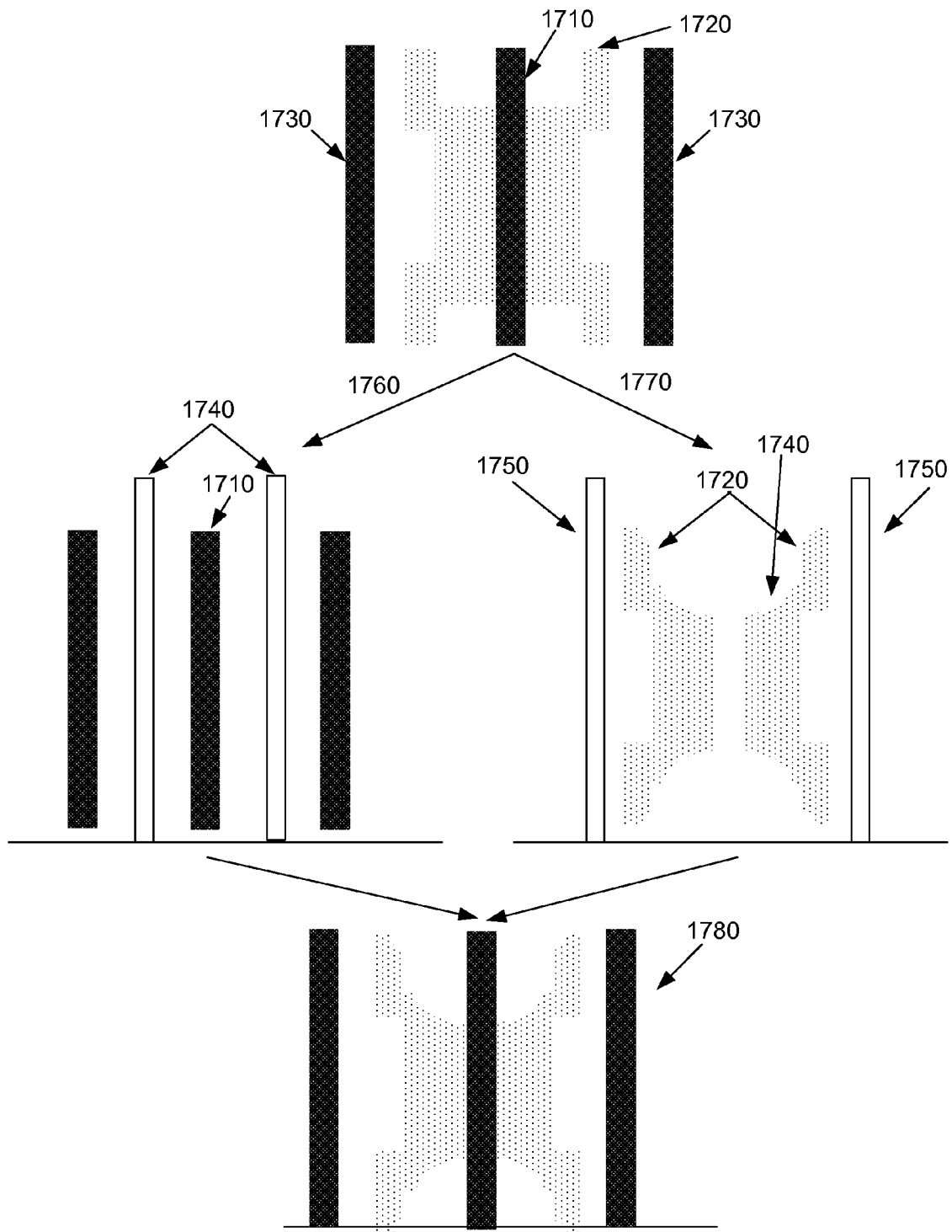
FIG. 17 illustrates a simulation for the photolithographic printing of the decomposition solution of FIG. 15 with neighboring polygons included.
Figure 18:
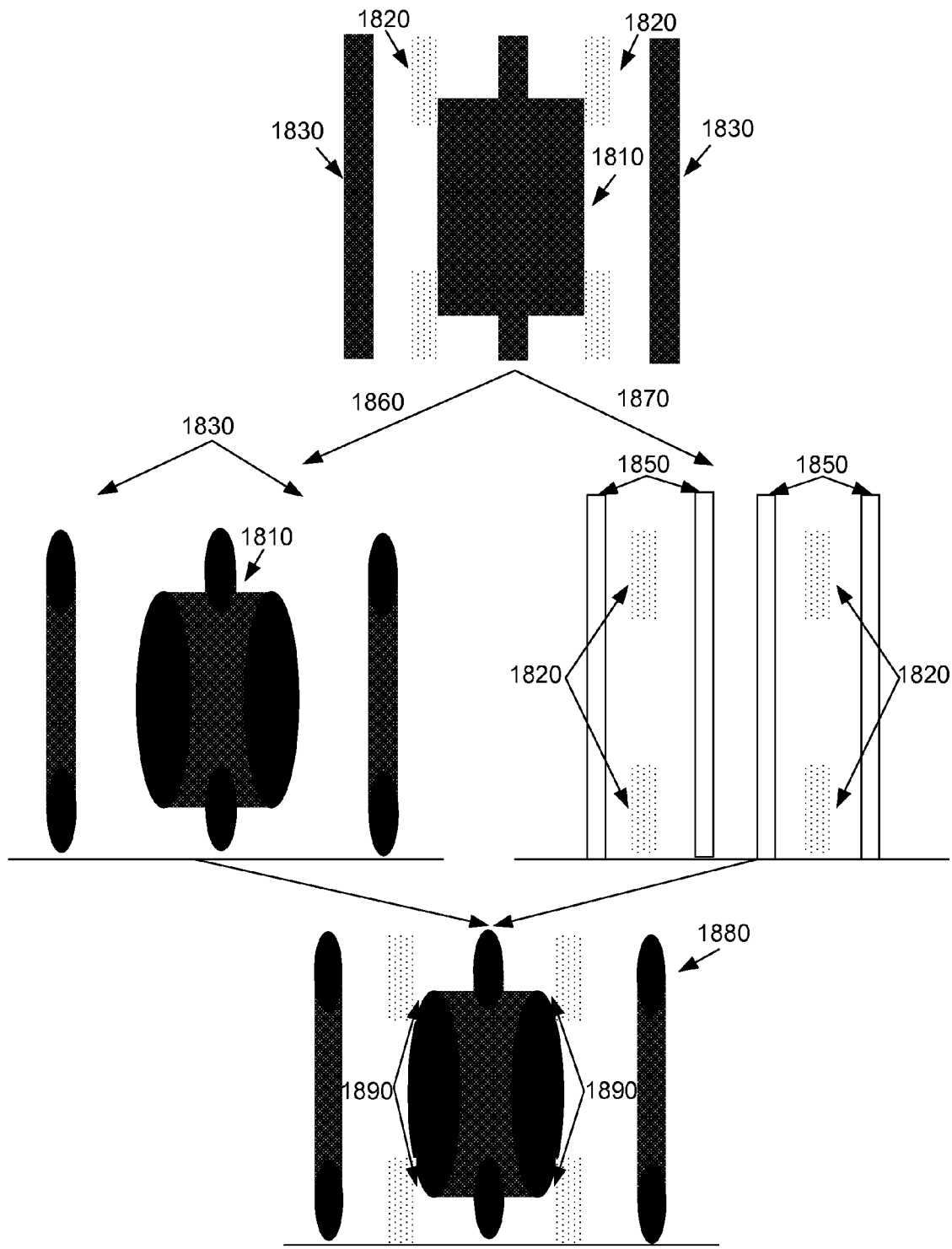
FIG. 18 illustrates a simulation for the photolithographic printing of the decomposition solution of FIG. 16 with neighboring polygons included.

FIGS. 17 and 18 illustrate OPC assist simulations for the decomposition solutions of FIGS. 15 and 16 when the neighboring polygons within the extended region 710 of FIG. 7 are included within the decomposition analysis. Specifically, FIG. 17 illustrates a simulation for the photolithographic printing of the decomposition solution of FIG. 15 with the neighboring polygons 1730 included. During the first exposure 1760, there is ample area on the first photo mask to include the OPC assist features 1740 between shape 1710 and the neighboring polygons 1730. During the second exposure 1770, there is ample area on the second photo mask to include the OPC assist features 1750 for the outer segments of shape 1720, though the inner segments experience similar pinching to the solution of FIG. 15. The resulting printed pattern 1780 thus remains a viable decomposition solution even when including the information regarding neighboring polygons.

The simulation for the photolithographic printing of the decomposition solution of FIG. 16 with the neighboring polygons 1830 is illustrated in FIG. 18. By including the neighboring polygons 1830, OPC assist simulation reveals that the decomposition solution of FIG. 16 might be a sub-optimal or invalid decomposition solution. Specifically, during the first exposure 1860, the shape 1810 and neighboring polygons 1830 are printed. However, there is insufficient area on the photo mask to include OPC assist features and therefore each of the shapes or polygons experience varying degrees of pinching. The second exposure 1870 has sufficient area to include the OPC assist features 1850 to improve the printability of shapes 1820 and therefore these shapes 1830 do not experience a measurable amount of pinching. Analysis of the final printed solution 1880 reveals that the amount of pinching at 1890 resulting during the first exposure may exceed tolerable thresholds. Such high level of pinching could result in unexpected opens between shapes 1810 and 1820 and therefore affect the conductivity or electrical performance of the printed shapes. Accordingly, when including the neighboring polygons 1830 within the decomposition analysis, some embodiments prefer the decomposition solution illustrated in FIGS. 15 and 17 as the optimal decomposition solution over the decomposition solutions of FIGS. 16 and 18.

D. Chemical Mechanical Polishing Simulation

Chemical mechanical polishing (CMP) simulation is another simulation that may be integrated as part of the decomposition analysis performed by some embodiments. CMP involves a process whereby a corrosive chemical slurry is combined with an abrasive. Together the corrosive chemical and the abrasive even out irregular topographies along the printed wafer in order to bring the surface of the wafer within the depth of field of a photolithographic process. However, a side effect of CMP is that the polishing process sometimes removes unintended elements from the printed wafer. This byproduct may produce dishing at certain locations within the actual printed wafer that results in degraded line widths or unexpected opens between otherwise connected elements. In some embodiments, chemical mechanical polishing simulation identifies patterns that when decomposed and undergo CMP, result in an excessive amount of dishing.

Figure 19A:
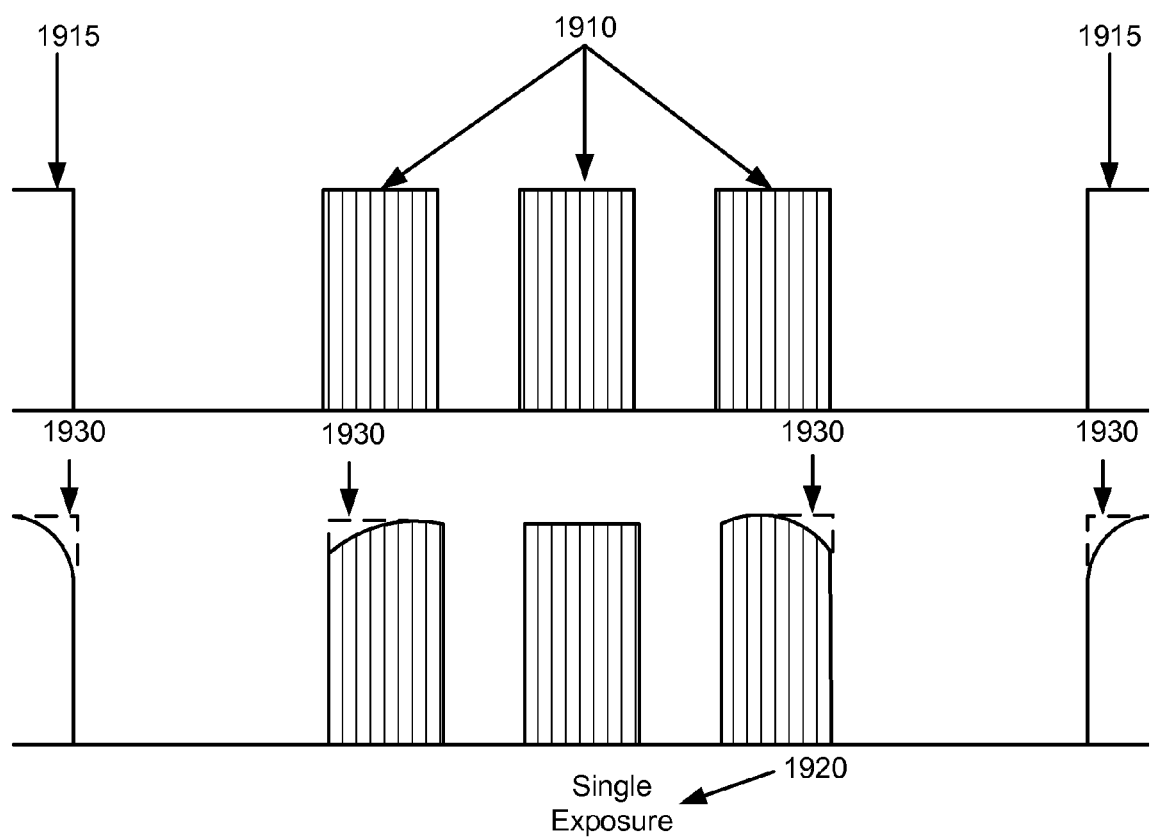
FIG. 19A conceptually illustrates an amount of dishing that occurs to three neighboring wire segments and portions of two non-neighboring wire segments from CMP within a single exposure photolithographic process.

FIG. 19A conceptually illustrates an amount of dishing that occurs to three neighboring wire segments 1910 and portions of two non-neighboring wire segments 1915 from CMP within a single exposure photolithographic process. In this figure, all wire segments 1910 and 1915 are printed onto a wafer during the same lithographic exposure process 1920. The wire segments 1910 and 1915 undergo CMP. When the distance between two elements is sufficiently large, the elements will experience some level of dishing as a result of CMP. Hence, while the middle wire segment of the three neighboring wire segments 1910 experiences little to no dishing, the outer two neighboring wire segments and the portions of the non-neighboring wire segments 1915 each experience a measurable amount of dishing 1930 due to the distance separating the elements being sufficiently large.

Figure 19B:
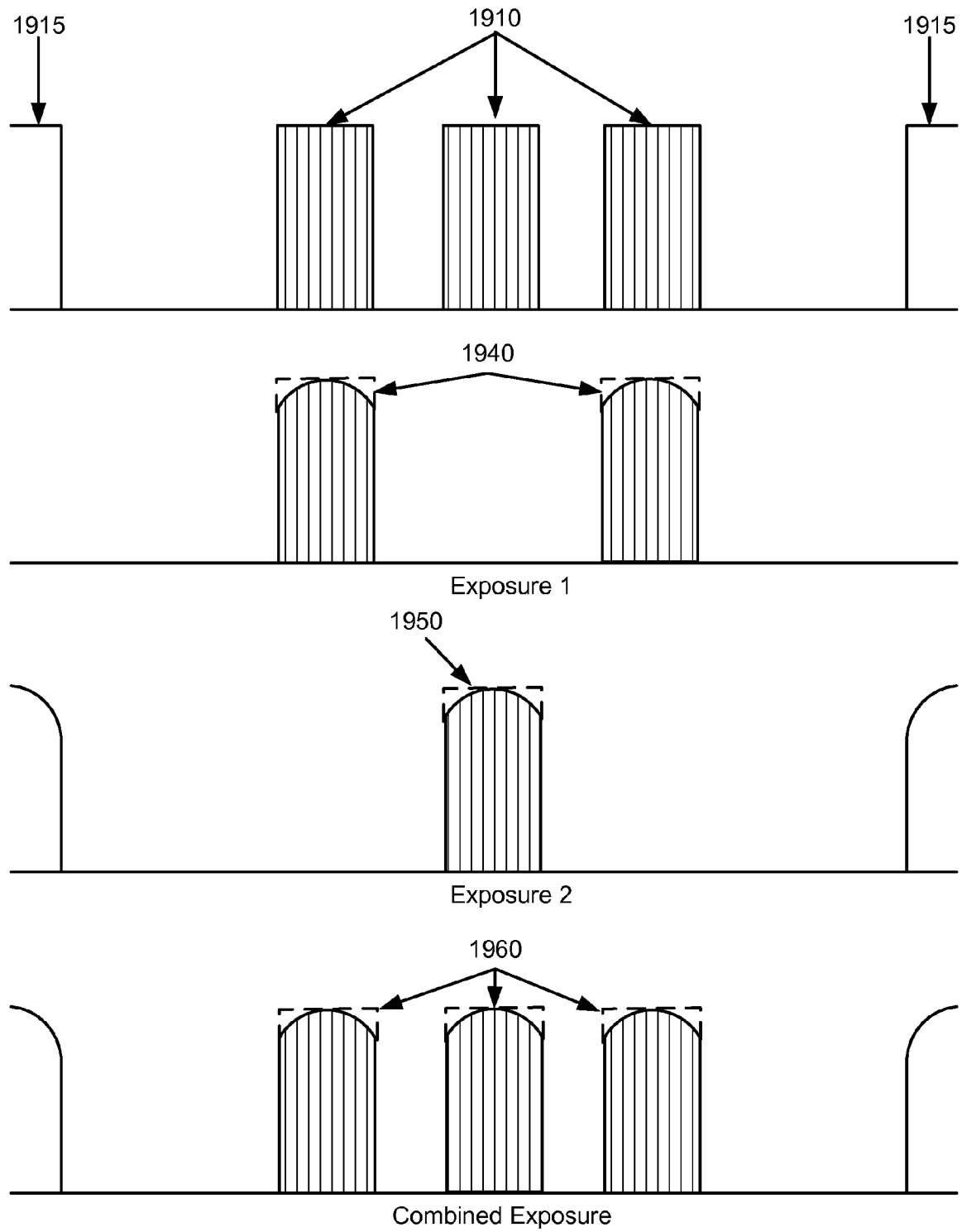
FIG. 19B conceptually illustrates an amount of dishing that occurs to three neighboring wire segments and the portions of the two non-neighboring wire segments from CMP when the three neighboring wire segments are printed according to separate exposures within a multiple exposure photolithographic process.

FIG. 19B conceptually illustrates an amount of dishing that occurs to the same three neighboring wire segments 1910 and the portions of the two non-neighboring wire segments 1915 from CMP when the wire segments 1910 and 1915 are printed according to separate exposures within a multiple exposure photolithographic process. In the multiple exposure process, wire segments 1940 are printed using a first exposure and the wire segment 1950 and the non-neighboring wire segments 1915 are printed using a second exposure.

As only the wire segments 1940 are printed after the first exposure, the distance between the wire segments 1940 is sufficiently large where both segments experience dishing. Similarly, the second exposure prints wire segment 1950 and the portions of wire segments 1915 where the distance between the printed segments of the second exposure is sufficiently large so that all segments of the second exposure also experience dishing as a result of CMP.

Due to dishing resulting from the CMP, the actual printed line widths 1960 are different than those specified within the layout. The amount of dishing in the multi-exposure process of FIG. 19B is greater than the amount of dishing occurring within the single exposure process of FIG. 19A. If the line widths 1960 of the multi-exposure process of FIG. 19B exceed an allowable dishing threshold, then the decomposition solution of FIG. 19B is sub-optimal and a new decomposition solution will be provided to satisfy the dishing threshold.

In some embodiments, correcting CMP errors involves adding fill shapes to correct the dishing or gap errors. Some embodiments as part of the analysis process determine the location and amount of fill shapes needed to correct the identified errors. However, due to the complexities involved within a multiple exposure photolithographic process, such corrections may introduce additional errors in subsequent exposures. For example, a dish or gap error may be introduced during a printing of a first mask. Fill shapes may be used to correct the errors for the first printed mask. However, during the printing of a second mask, the fill shapes that were used to correct the first printing errors may overlap with a shape printed during the printing of the second mask. If the features are designed to remain separate, the overlap caused by the fill shape may result in a short between the two features. Accordingly, the analysis and simulation engines of some embodiments perform a robust analysis and simulation to identify and correct fill shape errors.

E. Overlay Simulation

Analytics and simulations to account for mask overlay errors can similarly be integrated into some embodiments. Some embodiments identify features within the design layout that exceed specified mask overlay error tolerances that relate to the transfer of the exposure to two different masks. The mask overlay error tolerance determines various combinations of misalignment that may occur when splitting the printing of a design from a single exposure process to a multiple exposure process. By performing mask overlay error simulation, some embodiments can account for such errors and provide a decomposition solution that reduces or eliminates the possibility of a mask overlay error.

Figure 20:
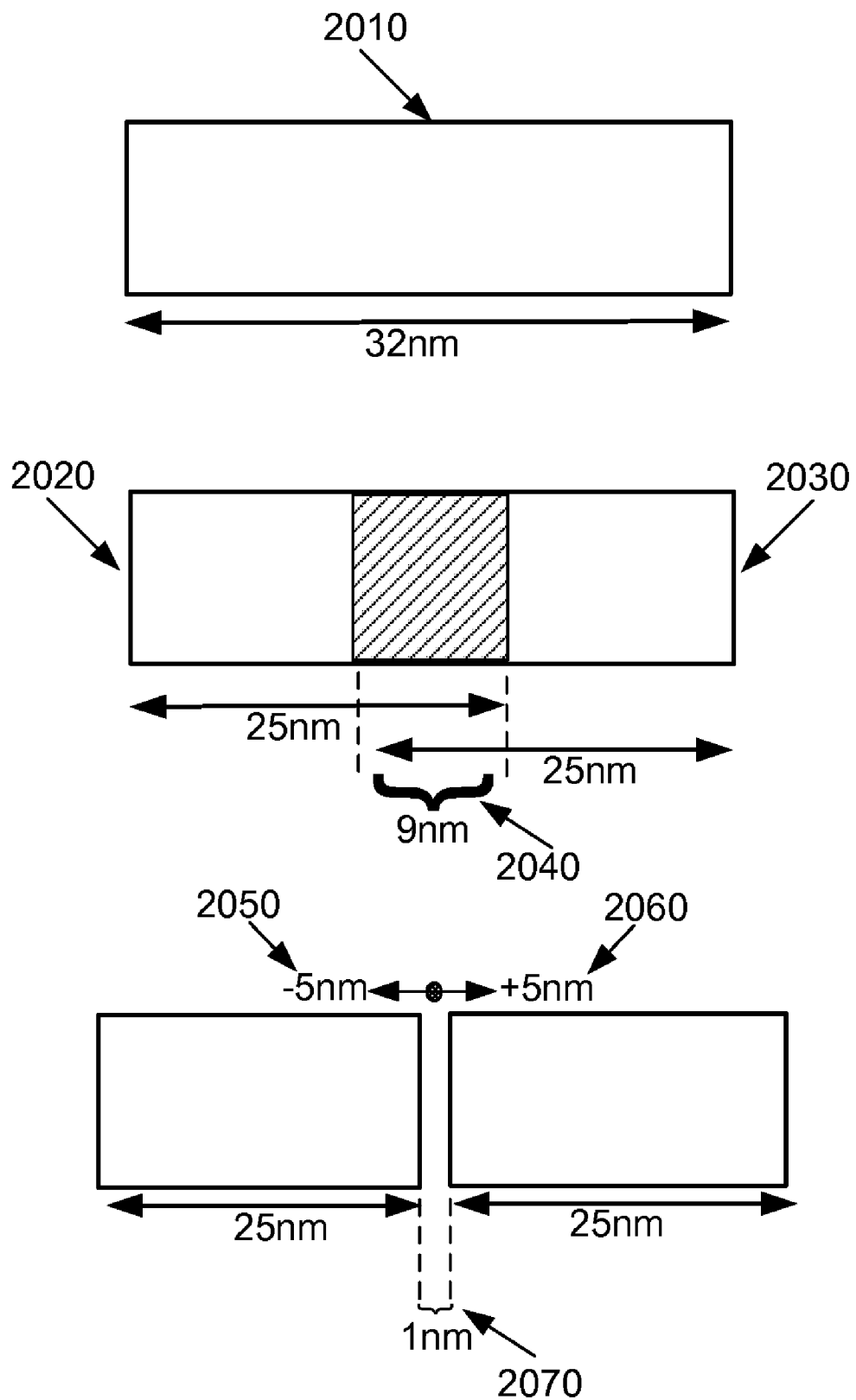
FIG. 20 illustrates the identification of an overlay error that occurs within a layout decomposition.

FIG. 20 illustrates the identification of an overlay error that occurs within a layout decomposition in accordance with one or more simulations performed by some embodiments. In FIG. 20, a pattern 2010 is decomposed into two shapes 2020 and 2030 that are assigned to separate photo masks for printing during separate exposures of a multi-exposure photolithographic process. As shown, the shapes 2020 and 2030 are 32 nanometers (nm) in width and are specified to overlap by 9 nm 2040 during printing. However, during simulation some embodiments identify that the particular photolithographic process involved specifies an overlay error of +/−5 nm. The overlay error is potentially larger than the specified overlap. For instance, if in a first exposure the shape 2020 is printed with the maximum negative overlay error of −5 nm 2050 and if in a second exposure the shape 2030 is printed with the maximum positive overlay error of +5 nm 2060, then an open 2070 of 1 nm results between the two shapes 2020 and 2030.

Figure 21:
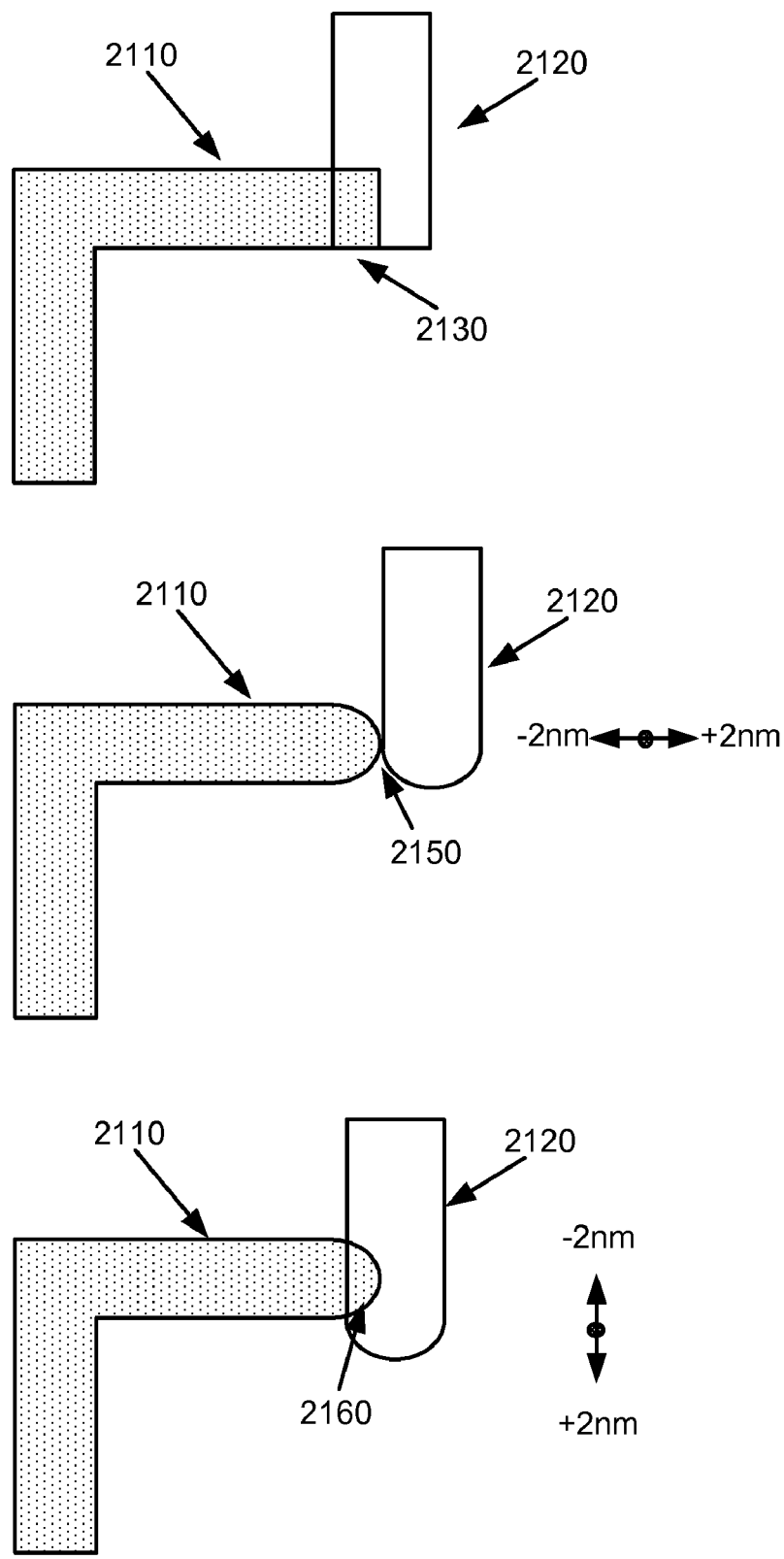
FIG. 21 presents a simulation for identifying a mask overlay error within a particular decomposition solution.

FIG. 21 presents a simulation for identifying a mask overlay error within a particular decomposition solution. In this figure, a pattern is decomposed into two shapes 2110 and 2120 which contain an overlapping area 2130. Mask overlay simulation of this decomposition solution reveals that in a photolithographic process with an overlay misalignment occurring along the horizontal axis, an open may result between the shapes 2110 and 2120 as the overlapping area is reduced to 2150. However, such a decomposition solution meets overlay simulation where the overlay misalignment occurs along the vertical axis. As illustrated, no open results from the vertical overlay error as the overlapping area 2160 is sufficient to establish the desired connection between the shapes 2110 and 2120.

Figure 22:
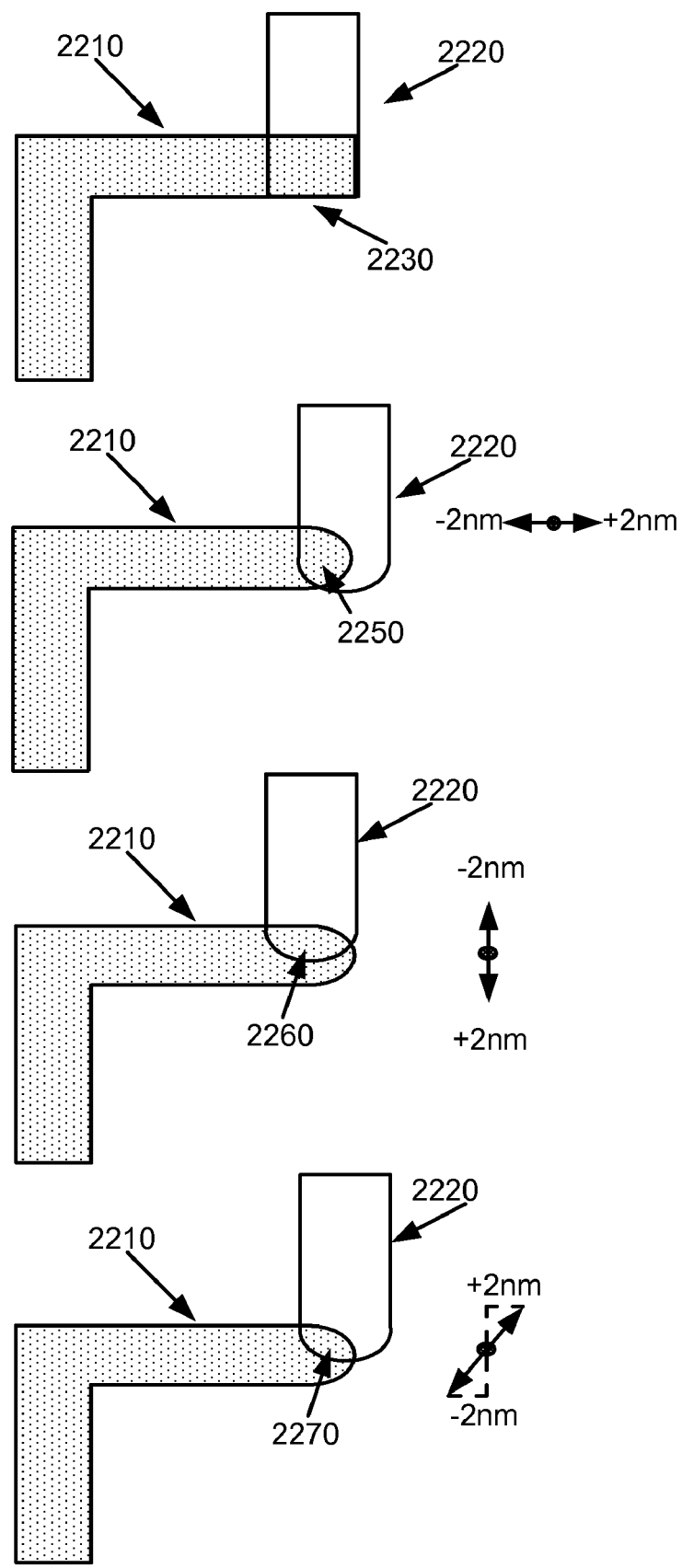
FIG. 22 presents a simulation for a decomposition solution that when simulated satisfies all potential mask overlay misalignments.

FIG. 22 presents a simulation for a decomposition solution that when simulated satisfies all potential mask overlay misalignments. In this figure, a pattern is decomposed into two shapes 2210 and 2220 which contain an overlapping area 2230. The overlapping area 2230 is larger than the overlapping area 2130 for the decomposition solution of FIG. 21. As a result, the decomposition solution presented in FIG. 22 is not subject to mask overlay errors occurring along either the horizontal axis, vertical axis, or combined horizontal and vertical axes. The simulation reveals that for a maximum overlay misalignment along the horizontal axis, the decomposition solution maintains an overlapping area 2250. Similarly, for a maximum overlay misalignment along the vertical axis, the decomposition solution maintains an overlapping area 2260 and for a maximum overlay misalignment along both the horizontal axis and the vertical axis, the decomposition solution maintains an overlapping area 2270. Since the decomposition solution presented in FIG. 22 is not subject to mask overlay error, this decomposition solution is preferable over the decomposition solution presented in FIG. 21.

Similar to mask overlay error simulation which identifies overlay errors during the photolithographic printing of the design layout, mask edge placement simulation accounts for placement errors that occur during the creation of the mask used within the photolithographic printing. To create a photo mask, an electron beam (EBeam) process is used to define the shapes appearing on the photo mask. This mask definition process can be simulated in a manner similar to the mask overlay errors for photolithographic printing. Ebeam machines operate with certain tolerances and photo mask templates with certain design specifications may exceed the operating tolerances of the mask writer causing certain shapes of a design layout to be improperly created on the photo mask. As illustrated above with reference to FIG. 21, different simulations assist in identifying which of several decomposition solutions is best suited to satisfy the mask edge placement constraints from a particular photo mask creation process.

Some embodiments permit various other simulations as part of the decomposition analysis. One such example simulates mask loading effects to account for photo mask generation issues arising from unevenly distributed masks for a multi-exposure process. Mask loading effects account for changes in the etch rate in response to a change in the available amount of a reactant during an etch process. Therefore, an even distribution of features across multiple masks overcomes issues related to a first mask containing only isolated features and a second mask containing a dense distribution of features. Simulation can thus be used to identify a preferred or optimal distribution of shapes to satisfy the mask loading effects.

F. Critical Area Simulation

In some embodiments, the analysis engine in conjunction with the one or more simulation engines performs a critical area analysis when determining the decomposition solution for an extracted pattern. Such critical area analysis simulation is useful in determining the desirability of a particular decomposition solution with respect to critical areas of the design layout. Critical area analysis determines where defects can fall in between particular gaps of features. Typically, the size of a critical area is predetermined by the particular photolithographic process used to print the design. Any two features that fall within the critical area will be subject to further analysis and possibly an alternative decomposition.

Figure 23:
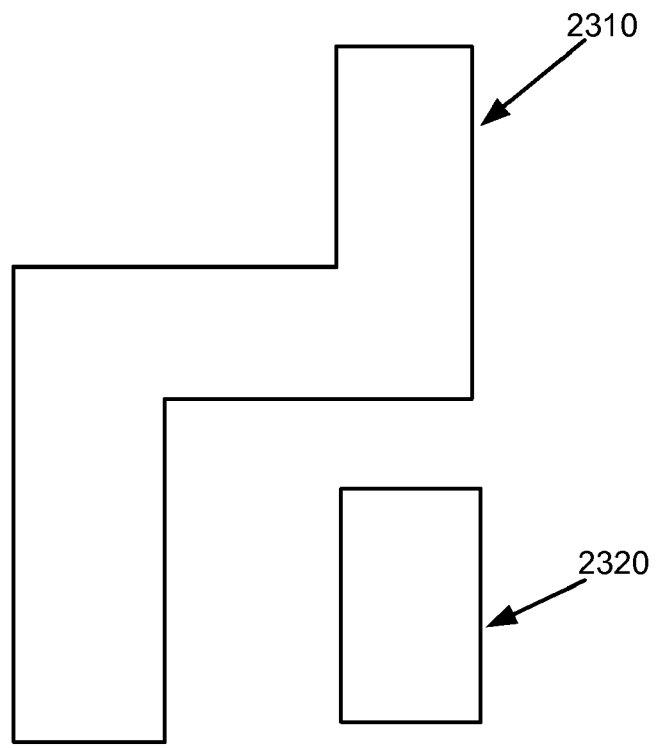
FIG. 23 illustrates a pattern whose decomposition must satisfy different error defects imposed during critical area analysis.
Figure 24:
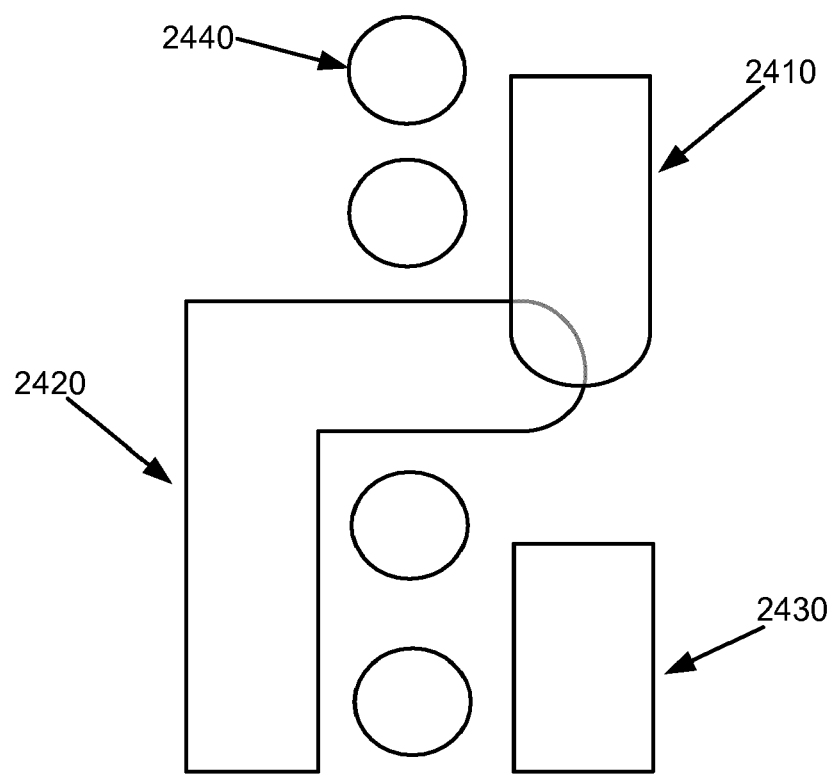
FIG. 24 illustrates a decomposition solution that satisfies a particular critical area analysis simulation.

FIG. 23 illustrates a pattern 2310 whose decomposition in conjunction with pattern 2320 must satisfy different error defects imposed during critical area analysis. FIG. 24 illustrates a first decomposition solution for the pattern 2310, where the pattern 2310 is decomposed into a first shape 2410 which is assigned to a first photo mask for printing during a first exposure and a second shape 2420 which is assigned to a second photo mask for printing during a second exposure. Shape 2430 is also assigned to the first photo mask to be printed along with shape 2410 during the first exposure. Also, FIG. 24 includes a set of critical areas 2440 that the decomposition solution must satisfy in order to become a valid decomposition solution. Each critical area 2440 represents a potential defect that may be introduced during photolithographic printing and any overlap of the decomposition solution with a critical area could result in a manufacturing error.

The shapes 2410, 2420, and 2430 are passed to the simulation engines to undergo critical area simulation. The simulation identifies the set of critical areas 2440 and determines that no violation has occurred. As such, the decomposition solution of FIG. 24 is determined to satisfy critical area analysis for the critical areas 2440.

Figure 25:
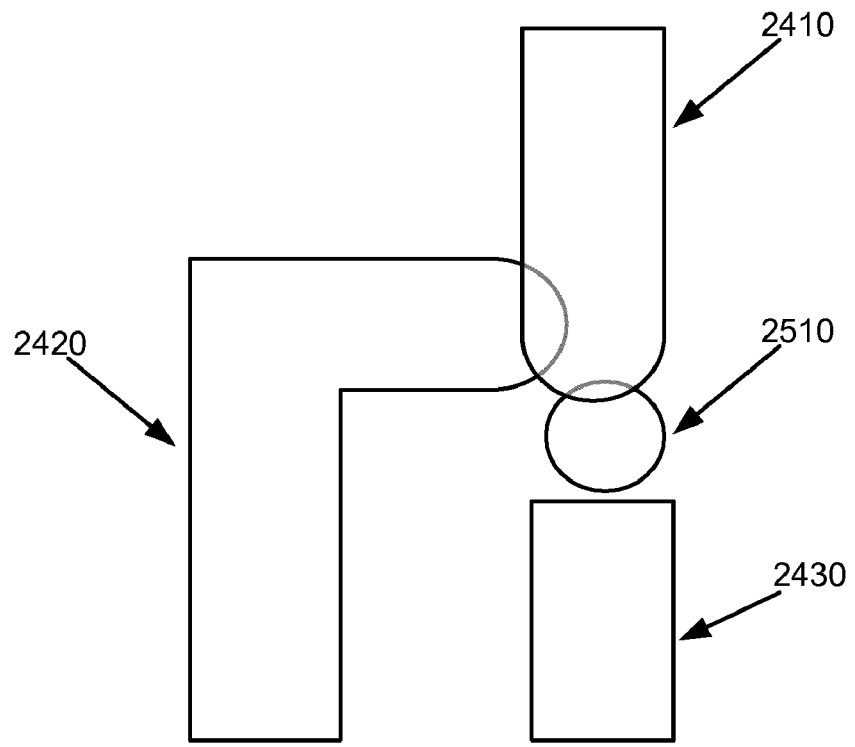
FIG. 25 illustrates the decomposition solution of FIG. 24 failing a different critical area analysis simulation.

However, FIG. 25 illustrates the decomposition solution of FIG. 24 with a critical area at 2510 that causes the decomposition solution to violate critical area analysis. The critical area simulation for FIG. 25 identifies location 2510 as a critical area because during printing a short may result between the shapes 2410 and 2430 as a result of one or more defects occurring during photolithographic printing. The analysis engine will therefore attempt to identify alternate decompositions that satisfy the critical area analysis simulation.

Figure 26:
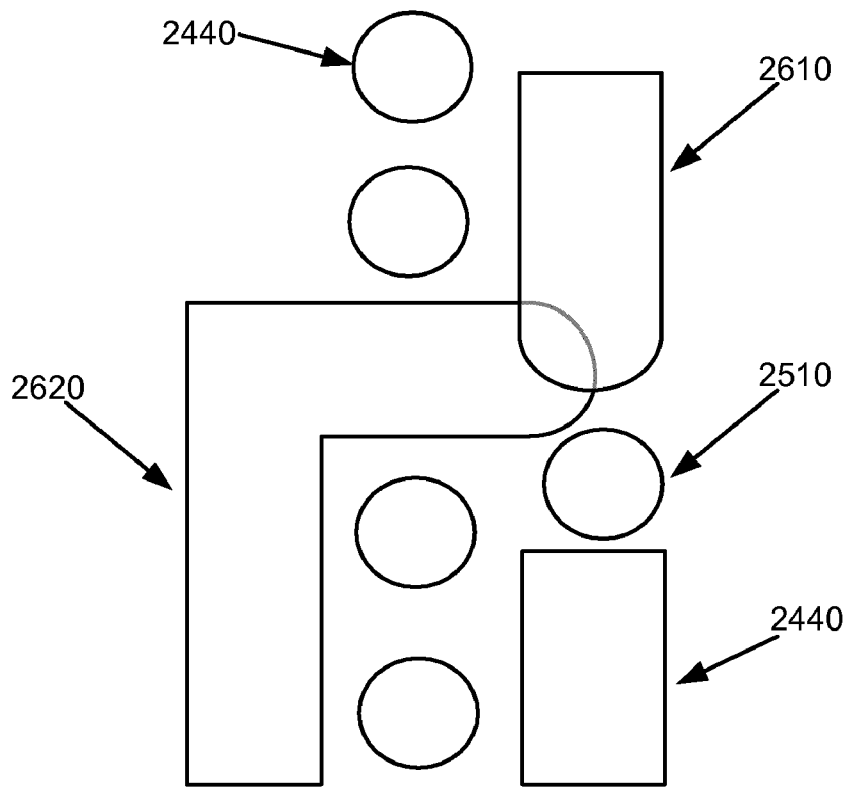
FIG. 26 illustrates a decomposition solution that satisfies all critical area constraints.

FIG. 26 illustrates a decomposition solution that does not violate either of the critical area constraints imposed in FIGS. 24 and 25. In FIG. 26, the pattern 2310 is decomposed into shape 2610 for printing during a first exposure and shape 2620 for printing during a second exposure. This alternate decomposition contains a similar area of overlap as the decomposition solution of FIG. 24, but the area of overlap is decomposed in such a manner so as to satisfy the defects appearing at the critical areas 2440 and 2510.

Hotspot simulation provides an additional simulation for identifying areas within the layout that have undergone decomposition and the various simulations, but that still do not satisfy a specified printability tolerance. In some embodiments, "hotspots" represent areas of high density of features where pinching, bridging, or other errors may occur. A particular mask assignment for the decomposed patterns may alleviate some of the various problems associated with the hotspots. However, in some embodiments it is necessary to notify the layout designer of the hotspots and therefore an error is presented to the layout designer indicating the hotspot area.

G. Flash Count Simulation

While the simulation engines thus far have been described to identify and address various photolithographic printability issues, some embodiments provide decomposition analysis and simulation to address other factors such as cost concerns related to the fabrication process. Flash count simulation provides a method to reduce fabrication costs associated with a design layout.

During flash count simulation, patterns appearing within the design layout are fractured into primitives such as rectangles, trapezoids, and triangles. The primitives represent the Ebeam flashes required to generate the various photo mask. The number of flashes or flash count determines how much machine mask shops charge to generate the photo masks. Therefore, by accounting for such factors when performing the pattern decomposition, some embodiments provide an optimal decomposition solution that reduces the overall costs associated with the actual photolithographic printing of the design layout.

Figure 27:
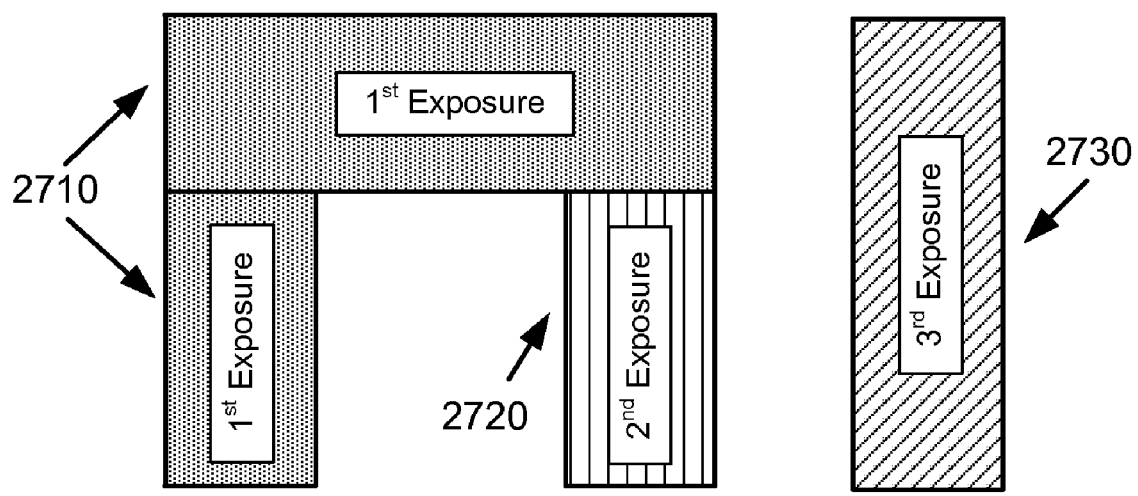
FIG. 27 presents a sub-optimal decomposition solution for shapes and a sub-optimal assignment of the shapes to different photo masks.
Figure 28:
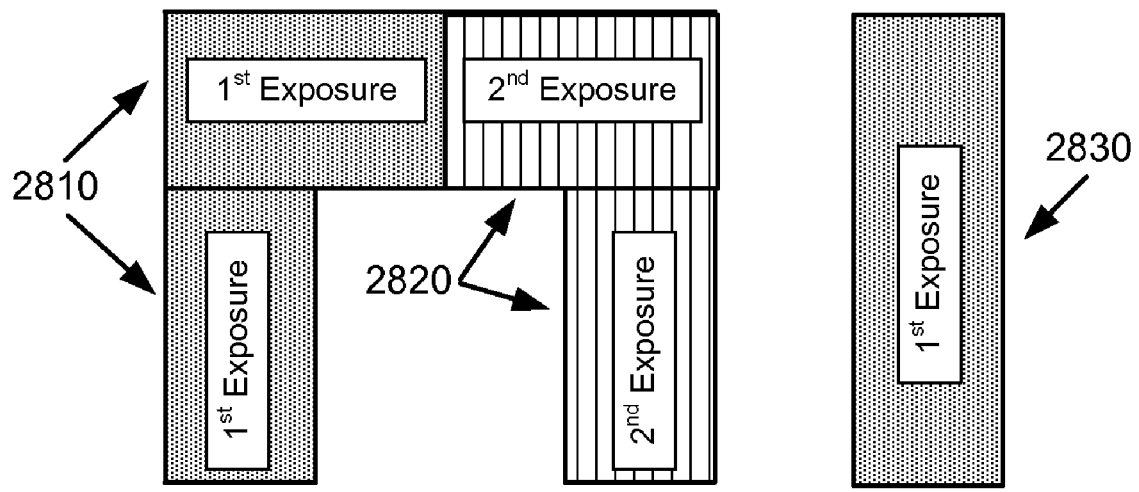
FIG. 28 presents a more optimal decomposition for and assignment of the shapes of FIG. 27 that results in cost savings as fewer photo masks and fewer exposures are needed to print the design.

FIGS. 27 and 28 illustrate a simulation that accounts for cost considerations associated with the photolithographic printing of a design layout using multiple exposures. FIG. 27 presents a sub-optimal decomposition of shapes 2710-2730 that leads a sub-optimal assignment of shapes 2710-2730 to different photo masks. In this figure, the shape 2710 is assigned to a first photo mask for printing during a first exposure, shape 2720 is assigned to a second photo mask for printing during a second exposure, and shape 2730 is assigned to a third photo mask for printing during a third exposure. Therefore, the shapes of FIG. 27 are decomposed in a manner that requires the creation of three separate photo masks and three separate exposures. By reducing the number of photo masks needed to print a design layout, some embodiments reduce the overall costs associated with the fabrication of a design layout.

FIG. 28 presents a more optimal decomposition solution for and assignment of the shapes of FIG. 27 that results in cost savings as fewer photo masks and fewer exposures are needed to print the design. In FIG. 28, the shapes 2810 and 2830 are decomposed in a manner so that both shapes 2810 and 2830 are assigned to the same photo mask for printing during the same exposure. The shape 2820 is assigned to a separate photo mask for printing during a different exposure. However, the decomposition solution presented in FIG. 28 results in one less photo mask and one less exposure than the decomposition solution presented in FIG. 27. Therefore, when simulating cost considerations the decomposition solution of FIG. 28 will be preferred over FIG. 27

The flash count analysis and simulation performed by some embodiments also account for the various OPC assist features that are printed onto the photo mask to assist in the printability of the patterns on the photo mask to a physical wafer. The OPC assist features themselves are not printed onto the wafer, but they nevertheless appear on the photo mask. Therefore, space needs to be allocated on the photo mask to include the OPC assist features. As described above, some OPC treatments include off-axis illumination, alternating phase shift masks, and scatter bars as some examples of OPC assist features that improve the printability of particular patterns appearing within the photo mask.

Figure 29:
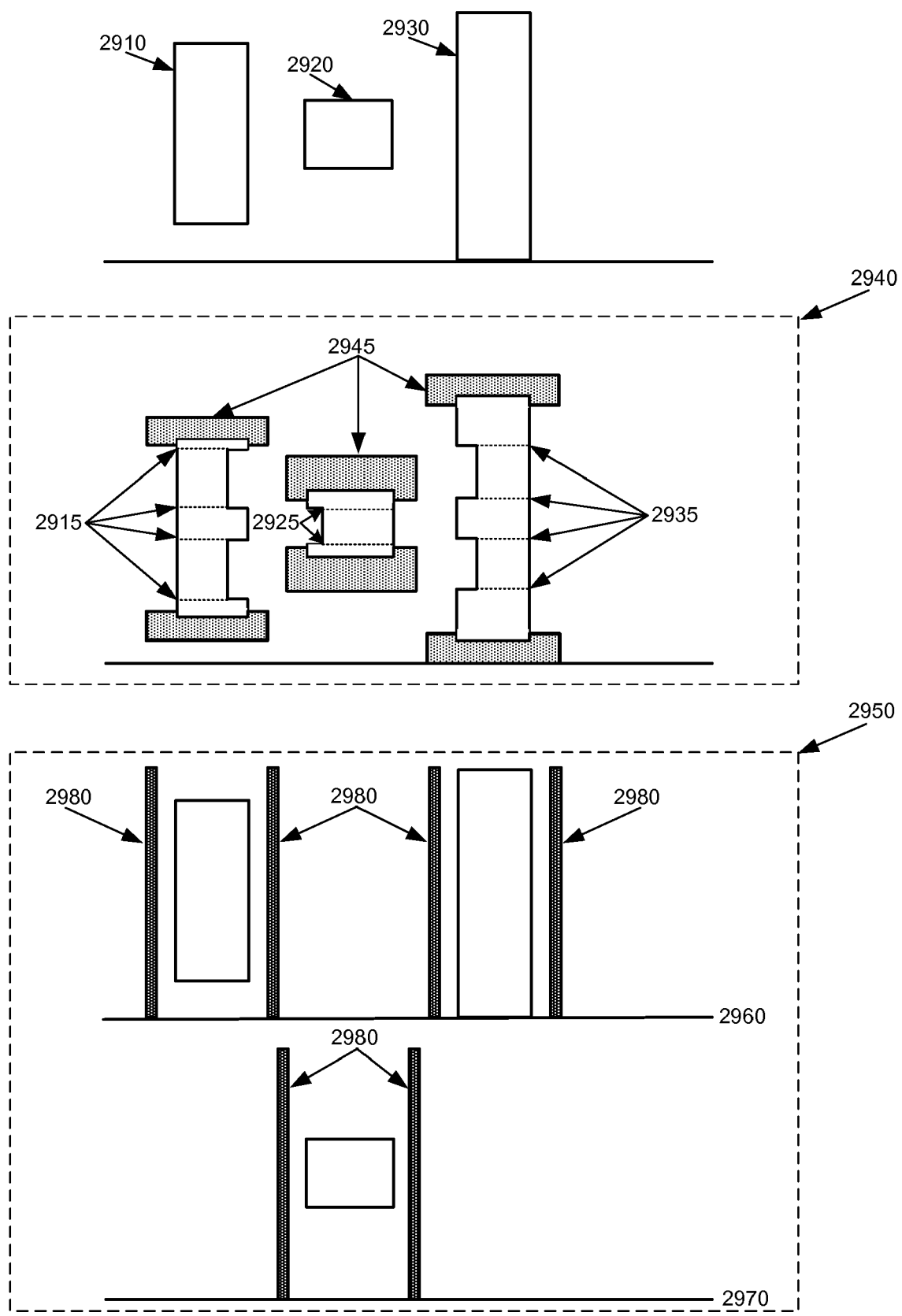
FIG. 29 presents a decomposition solution that reduces the number of flash counts needed for printing a set of three patterns by accounting for various OPC assist features such as scatter bars.

FIG. 29 presents a decomposition solution that reduces the number of flash counts needed for printing a set of three patterns 2910, 2920, and 2930 by accounting for various OPC assist features such as scatter bars. When the three patterns 2910, 2920, and 2930 are included within a single exposure printing process 2940, there is insufficient space on the photo mask to include scatter bars to improve the printability of the patterns 2910, 2920, and 2930. Since the accuracy for printing the patterns 2910, 2920, and 2930 is reduced without the OPC assist features (e.g., scatter bars), alternative measures are taken to avoid printing errors such as bridging from occurring.

In the single exposure process 2940, the patterns 2910, 2920, and 2930 are fractured into several smaller primitives 2915, 2925, and 2935 where some primitives include concavities to account for possible bridging with a neighboring pattern. Also, hammerheads 2945 are introduced to reduce corner rounding and line shortening. The fracturing of the patterns 2910, 2920, and 2930 into additional primitives and the inclusion of the hammerheads 2945 all increase the number of flash counts needed to print the three patterns 2910, 2920, and 2930.

However, by decomposing the three patterns 2910, 2920, and 2930 into two separate exposures for a multi-exposure process 2950, the photo masks have sufficient space to include the OPC assist features. As such, the patterns 2910, 2920, and 2930 need not be further fractured into smaller primitives. This reduces the number of flash counts and the overall cost for printing the design. Therefore, as shown in FIG. 29, the multi-exposure process 2950 assigns patterns 2910 and 2930 to a first photo mask for printing during a first exposure 2960 and assigns pattern 2920 to a second photo mask for printing during a second exposure 2970. Furthermore, both the first and second photo masks include OPC assist features such as the scatter bars 2980 to assist in the accurate printing of the patterns 2910, 2920, and 2930. Since the patterns 2910, 2920, and 2930 assisted by the scatter bars 2980 can each be printed using a single flash, the total number of flash counts is reduced via the multi-exposure process 2950. The analysis and simulation engines of some embodiments are thus able to identify decompositions that optimally reduce costs associated with the lithographic printing of a design layout.

It should be apparent to one of ordinary skill in the art that some embodiments integrate a combination of some or all the above described analysis and simulation tools. For instance, some embodiments integrate photolithographic simulation with CMP simulation and critical area analysis, while other embodiments determine the optimum cutting location based on mask printability characteristics such as mask placement error, mask loading effects, and flash counts. Moreover, additional simulation tools may be added or removed as desired by the layout designer. For instance, some embodiments further perform analysis and simulation to account for various issues (e.g., alignment and bridging that may result at different contact points between the layers) associated with a multiple layer design. Therefore, the simulations described above do not provide a comprehensive list of applicable simulations, but rather a set of enumerated examples that are operable in conjunction with some embodiments.

IV. System Architecture Overview

Figure 30:
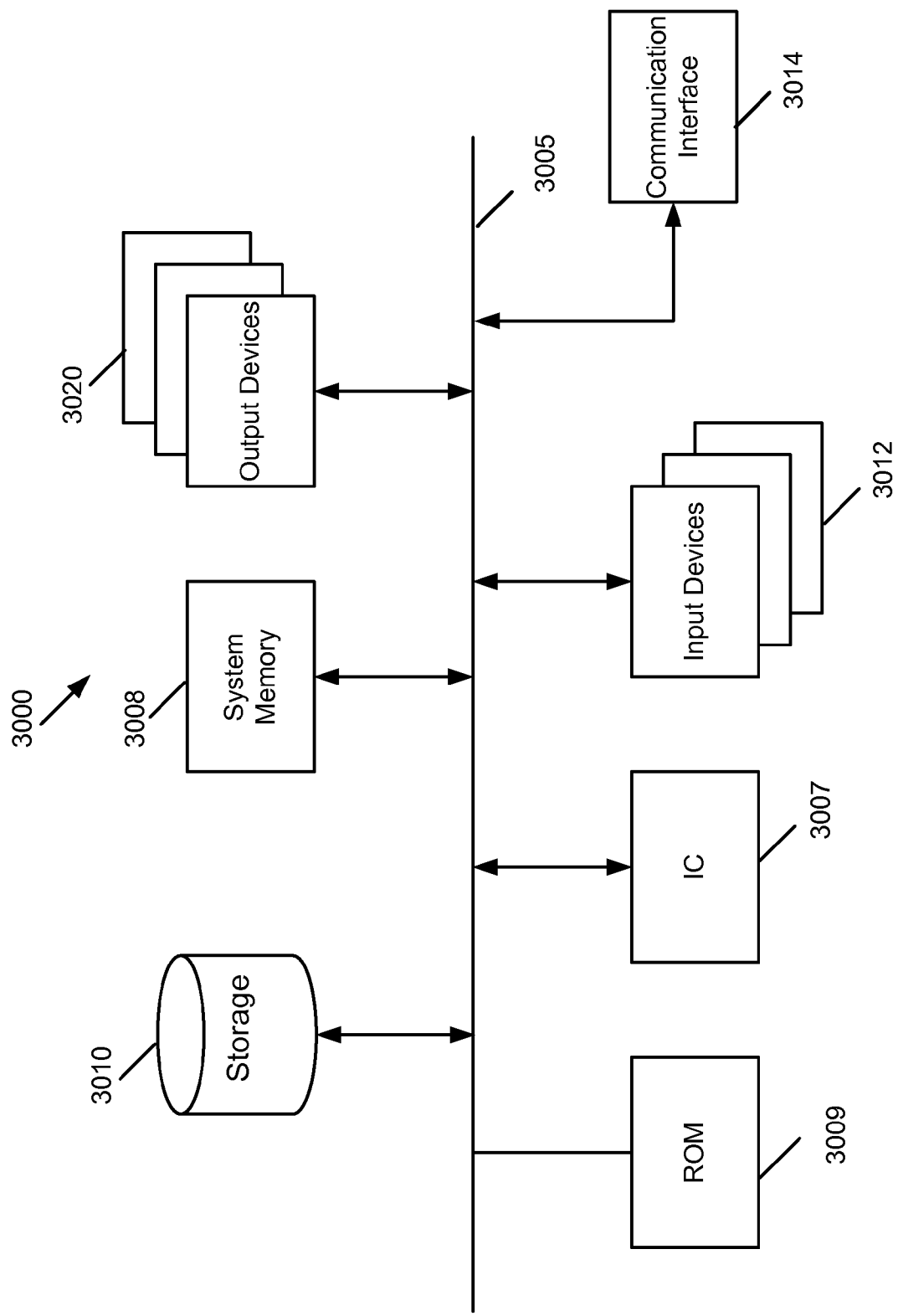
FIG. 30 is a block diagram of an illustrative computing system suitable for implementing an embodiment of the present invention.

FIG. 30 is a block diagram of an illustrative computing system 3000 suitable for implementing an embodiment of the present invention. Computer system 3000 includes a bus 3006 or other communication mechanism for communicating information, which interconnects subsystems and devices, such as processor 3007, system memory 3008 (e.g., RAM), static storage device 3009 (e.g., ROM), disk drive 3010 (e.g., magnetic or optical), communication interface 3014 (e.g., wireless 802.11b/g or Ethernet card), input device 3012 (e.g., keyboard or cursor control), and output device 3020 (e.g., display monitor).

According to one embodiment, computer system 3000 performs specific operations by processor 3007 executing one or more sequences of one or more instructions contained in system memory 3008. Such instructions may be read into system memory 3008 from another computer readable/usable medium, such as static storage device 3009 or disk drive 3010. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 3007 for execution. Such a medium may take many forms, including but not limited to, non-volatile media, volatile media, and transmission media. Non-volatile media includes, for example, optical or magnetic disks, such as disk drive 3010. Volatile media includes dynamic memory, such as system memory 3008. Transmission media includes coaxial cables, copper wire, and fiber optics, including wires that comprise bus 3006. Transmission media can also take the form of acoustic or light waves, such as those generated during radio wave and infrared data communications. Common forms of computer readable media includes, for example, floppy disk, flexible disk, hard disk, magnetic tape, any other magnetic medium, CD-ROM, any other optical medium, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 3000. According to other embodiments of the invention, two or more computer systems 3000 coupled by the communication interface 3014 (e.g., LAN, PTSN, or wireless network) may perform the sequence of instructions required to practice the invention in coordination with one another.

Computer system 3000 may transmit and receive messages, data, and instructions, including program, i.e., application code, through the communication interface 3014. Received program code may be executed by IC 3007 as it is received, and/or stored in disk drive 3010, or other non-volatile storage for later execution.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A method comprising:

identifying a pattern at a particular layer of a circuit design layout that does not meet at least one constraint;

for the identified pattern, identifying a plurality of different decomposition solutions that each divides the identified pattern into at least two regions;

at a computer, performing at least one simulation on each of the plurality of decomposition solutions to assess a manufacturing pattern that will result from each of the decomposition solutions;

for the identified pattern, selecting a decomposition solution from the plurality of decomposition solutions that meets the constraint based on results from the simulation; and replacing the identified pattern in the circuit design layout with the selected decomposition solution.

2. The method of claim 1, wherein identifying the plurality of different decomposition solutions comprises dividing said pattern into at least two shapes, each shape for assignment to a different mask for photolithographic printing during different photolithographic exposures.

3. The method of claim 1, wherein the constraint comprises a pitch constraint related to a particular photolithographic process used to print the circuit design layout.

4. The method of claim 1, wherein the constraint comprises a width constraint related to a particular photolithographic process used to print the circuit design layout.

5. The method of claim 1, wherein the identified pattern contains elements from at least two circuits of the circuit design layout.

6. The method of claim 1, wherein the simulation identifies locations where a photolithographic error occurs within the circuit design layout, wherein the photolithographic error comprises at least one of a pinching error or necking error resulting in between the decomposed pattern.

7. The method of claim 1, wherein the simulation identifies locations where decomposing the pattern into at least two shapes causes bridging or a short to occur within the circuit design layout during a photolithographic printing of the circuit design layout.

8. The method of claim 1, wherein the simulation comprises a mask overlay error simulation that determines combinations of misalignment between decomposed shapes of the pattern that occurs during photolithographic printing of the circuit design layout.

9. The method of claim 1, wherein the simulation comprises using chemical mechanical polishing simulation to identify dishing errors within the decomposed pattern.

10. The method of claim 1, wherein the simulation comprises identifying a decomposition solution that minimizes a number of flash counts needed to photolithographically print the decomposed pattern and the circuit design layout.

11. The method of claim 1, wherein identifying the plurality of different decomposition solutions comprises using a library to retrieve the decomposition solutions for the identified pattern when the identified pattern is previously stored within the library, wherein said library comprises a plurality of patterns with associated decomposition solutions.

12. The method of claim 1 further comprising (i) determining an optimal decomposition solution by comparing the simulation results for each identified decomposition solution and (ii) selecting a decomposition solution with a most optimal simulation result.

13. The method of claim 1 further comprising determining an optimal decomposition by (i) quantifying said simulation results to numerical values and (ii) selecting a decomposition solution with a highest numerical value.

14. The method of claim 1, wherein selecting the decomposition solution further comprises computing a value to quantify each of the produced simulation results.

15. The method of claim 14, wherein selecting the decomposition solution further comprises (i) combining the computed values produced by each simulation for each identified decomposition solution and (ii) selecting a potential decomposition solution with a largest combined value as the decomposition solution.

16. The method of claim 1, wherein selecting the decomposition solution comprises using at least two simulations.

17. The method of claim 1, wherein the divided regions of each of the plurality of identified decomposition solutions are different.

18. A method comprising:
identifying a pattern within a design layout that does not meet at least one manufacturing constraint;
at a computer, determining whether the pattern exists within a library, said library storing a plurality of patterns with corresponding decomposition solutions;
retrieving a decomposition solution for the pattern that satisfies the manufacturing constraint from the library when the pattern exists within the library; and
determining a decomposition solution for the pattern when the pattern does not exist within the library.

19. The method of claim 18 further comprising replacing the pattern within the design layout with the decomposition solution.

20. The method of claim 18, wherein the decomposition solution specifies a division of said pattern into at least two shapes, each shape for assignment to a different mask for photolithographic printing during different photolithographic exposures.

21. The method of claim 18, wherein determining the decomposition solution for the pattern comprises using at least one simulation to determine that the decomposition solution meets the manufacturing constraint.

22. The method of claim 18, wherein determining the decomposition solution further comprises storing said pattern and said decomposition solution within the library for retrieval during identification of the same pattern at a subsequent iteration.

23. A system comprising:
a location identifier for identifying a location within a circuit design layout that does not meet at least one manufacturing constraint;
a pattern extractor for extracting a pattern at said identified location;
a library for storing unique patterns and associated decomposition solutions; and
an analyzer for determining whether the extracted pattern exists within said library, the analyzer for retrieving, when the pattern exists within the library, said corresponding decomposition solutions specifying a set of decomposition solutions for the extracted pattern, the analyzer further for determining, when the pattern does not exist within the library, a decomposition solution for the extracted pattern using at least one simulation to determine that the decomposition solution meets the manufacturing constraint.

24. The system of claim 23 further comprising a pattern replacer for replacing the extracted pattern in the design layout with the decomposition solution.

25. A non-transitory computer readable medium storing a computer program which when executed by a processor decomposes patterns within a circuit design layout into multiple shapes for photolithographic printing in two or more exposures, the computer program comprising sets of instructions for:
identifying a pattern at a particular layer of the circuit design layout that does not meet at least one constraint;
identifying a decomposition solution for said pattern;
performing at least two different simulations on the identified decomposition solution to determine whether the decomposition solution meets the constraint, each simulation identifying errors that result from a different process from a plurality of processes performed during photolithographic printing of the circuit design layout; and when the decomposition solution meets the constraint, replacing the pattern in the circuit design layout with the decomposition solution.

26. The computer readable medium of claim 25, wherein identifying the decomposition solution comprises using a library to retrieve the decomposition solution for the pattern when the pattern is previously stored within the library, wherein said library comprises a plurality of patterns with associated decomposition solutions.

27. The computer readable medium of claim 25, wherein at least one of the simulations identifies locations where a photolithographic error occurs within the circuit design layout, the photolithographic error comprising at least one of a pinching error or a necking error resulting in between the decomposed pattern.

28. The computer readable medium of claim 25, wherein at least one of the simulations identifies locations where decomposing the pattern into at least two shapes causes bridging or a short to occur within the design layout during photolithographic printing of the design layout.

29. The computer readable medium of claim 25, wherein at least one of the simulations comprises a mask overlay error simulation that determines combinations of misalignment between decomposed shapes of the pattern that occurs during photolithographic printing of the design layout.

30. The computer readable medium of claim 25, wherein at least one of the simulations comprises using chemical mechanical polishing simulation to identify dishing errors within the decomposed pattern.

31. The computer readable medium of claim 25, wherein at least one of the simulations comprises identifying a decomposition solution that minimizes a number of flash counts needed to photolithographically print the decomposed pattern and the circuit design layout.

* * * * *